(12) United States Patent
Seo

(10) Patent No.: US 9,640,266 B1
(45) Date of Patent: May 2, 2017

(54) SEMICONDUCTOR MEMORY DEVICE AND OPERATING METHOD THEREOF

(71) Applicant: SK hynix Inc., Icheon-si, Gyeonggi-do (KR)

(72) Inventor: Ji Hyun Seo, Seoul (KR)

(73) Assignee: SK HYNIX INC., Icheon-si (KR)

( * ) Notice: Subject to any disclaimer, the term of this patent is extended or adjusted under 35 U.S.C. 154(b) by 0 days.

(21) Appl. No.: 15/266,318

(22) Filed: Sep. 15, 2016

(30) Foreign Application Priority Data

Apr. 25, 2016 (KR) .......................... 10-2016-0050344

(51) Int. Cl.
*G11C 16/04* (2006.01)
*G11C 16/12* (2006.01)

(52) U.S. Cl.
CPC ................................. *G11C 16/12* (2013.01)

(58) Field of Classification Search
USPC .............................. 365/185.11, 185.18, 185.24
See application file for complete search history.

(56) References Cited

U.S. PATENT DOCUMENTS 8,027,202 B2 * 9/2011 Lee ..................... G11C 16/0483
365/185.03

FOREIGN PATENT DOCUMENTS

KR 1020080103362 A 11/2008
KR 1020100010722 A 2/2010

* cited by examiner

*Primary Examiner* — Vu Le
(74) *Attorney, Agent, or Firm* — William Park & Associates Ltd.

(57) ABSTRACT

Provided herein is a semiconductor memory device and an operating method thereof. The semiconductor memory device may include a memory cell array, peripheral circuits, and a control logic. The memory cell array may include memory cells grouped into a plurality of pages. The peripheral circuits may perform a program operation for the plurality of pages. The control logic may control the peripheral circuits to perform the program operation by applying program voltages gradually increasing by a first step voltage to a selected page of the plurality of pages and by applying pass voltages gradually increasing by second step voltages to unselected pages of the plurality of pages. The second step voltages may vary depending on a position of the memory cells of the unselected pages in the memory cell array.

20 Claims, 18 Drawing Sheets

SEMICONDUCTOR MEMORY DEVICE AND OPERATING METHOD THEREOF

CROSS-REFERENCE TO RELATED APPLICATION

The present application claims priority under 35 U.S.C. §119(a) to Korean patent application number 10-2016-0050344 filed on Apr. 25, 2016, which is incorporated herein by reference in its entirety.

BACKGROUND

1. Technical Field

Various embodiments of the present disclosure generally relate to an electronic device, and more particularly to a semiconductor memory device and an operating method thereof.

2. Related Art

Semiconductor devices may be manufactured as integrated circuits. Semiconductor memory devices are data storage devices implemented on the integrated circuit. The semiconductor memory devices are classified into volatile memory devices and nonvolatile memory devices.

The nonvolatile memory device can retain data stored therein even when power is shut off or interrupted. Therefore, the nonvolatile memory device may be used for the task of secondary storage, which does not lose the data when the device is powered down. Examples of the nonvolatile memory device include a Read Only Memory (ROM), a Mask ROM (MROM), a Programmable ROM (PROM), an Erasable Programmable ROM (EPROM), an Electrically Erasable Programmable ROM (EEPROM), a flash memory, a Phase change Random Access Memory (PRAM), a Magnetic RAM (MRAM), a Resistive RAM (RRAM), a Ferroelectric RAM (FRAM), etc. The flash memory may be classified into a NOR type and a NAND type.

A memory cell array of the flash memory devices may have a two-dimensional structure in which memory cell strings are horizontally arranged on a semiconductor substrate. Alternatively, the memory cell array of the flash memory devices may have a three-dimensional structure in which the memory cell strings are vertically arranged on a semiconductor substrate.

SUMMARY

In an embodiment of the present disclosure, a semiconductor memory device may include a memory cell array, peripheral circuits, and a control logic. The memory cell array may include memory cells grouped into a plurality of pages. The peripheral circuits may perform a program operation for the plurality of pages. The control logic may control the peripheral circuits to perform the program operation by applying program voltages gradually increasing by a first step voltage to a selected page of the plurality of pages and by applying pass voltages gradually increasing by second step voltages to unselected pages of the plurality of pages. The second step voltages may vary depending on a position of the memory cells of the unselected pages in the memory cell array.

In an embodiment of the present disclosure, an operating method of a semiconductor memory device for a program operation of a memory block including a plurality of pages having a plurality of memory cells successively stacked along a vertical plug on a semiconductor substrate may be provided. The operating method may include applying program voltages gradually increasing by a first step voltage to a selected page of the plurality of pages, and applying pass voltages gradually increasing by second step voltages to unselected pages of the plurality of pages. The second step voltages of the pass voltages applied to the unselected pages may vary depending on a position of the memory cells of the unselected pages in the memory cell array.

DETAILED DESCRIPTION

Figure 1:
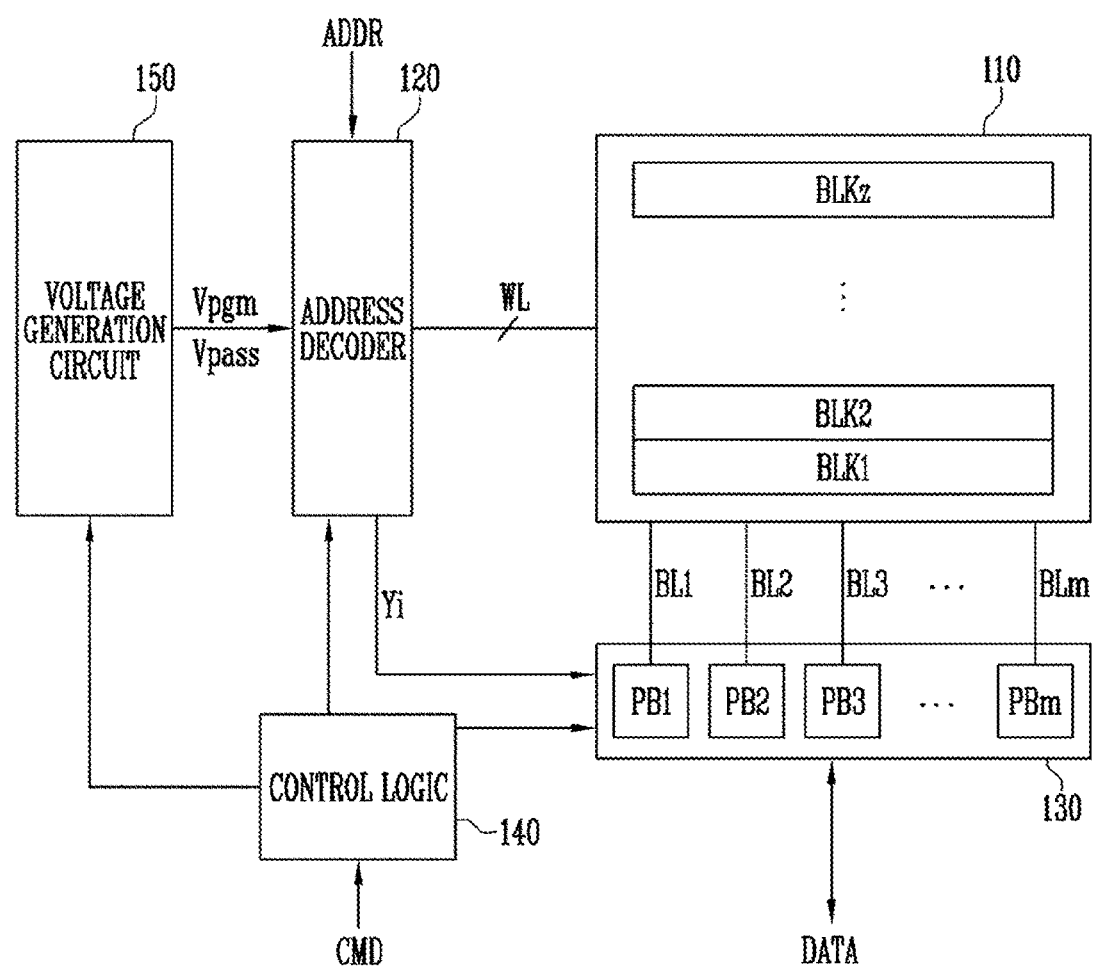
FIG. 1 is a diagram illustrating an example of a semiconductor memory device according to an embodiment of the present disclosure.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

Hereinafter, embodiments will be described in greater detail with reference to the accompanying drawings. Embodiments are described herein with reference to cross-sectional illustrations that are schematic illustrations of embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but may include deviations in shapes that result, for example, from manufacturing. In the drawings, lengths and sizes of layers and regions may be exaggerated for clarity. Like reference numerals in the drawings denote like elements.

Terms such as 'first' and 'second' may be used to describe various components, but they should not limit the various components. Those terms are only used for the purpose of differentiating a component from other components. For example, a first component may be referred to as a second component, and a second component may be referred to as a first component and so forth without departing from the spirit and scope of the present disclosure. Furthermore, 'and/or' may include any one of or a combination of the components mentioned.

Furthermore, a singular form may include a plural from as long as it is not specifically mentioned in a sentence. Furthermore, "include/comprise" or "including/comprising" used in the specification represents that one or more components, steps, operations, and elements exist or are added.

Furthermore, unless defined otherwise, all the terms used in this specification including technical and scientific terms have the same meanings as would be generally understood by those skilled in the related art. The terms defined in generally used dictionaries should be construed as having the same meanings as would be construed in the context of the related art, and unless clearly defined otherwise in this specification, should not be construed as having idealistic or overly formal meanings.

It is also noted that in this specification, "connected/coupled" refers to one component not only directly coupling another component but also indirectly coupling another component through an intermediate component. On the other hand, "directly connected/directly coupled" refers to one component directly coupling another component without an intermediate component.

FIG. 1 is a diagram illustrating an example of a semiconductor memory device according to an embodiment of the present disclosure.

Referring to FIG. 1, a semiconductor memory device 100 includes a memory cell array 110, an address decoder 120, a read/write circuit 130, a control logic 140, and a voltage generation circuit 150.

A plurality of memory cells of the semiconductor memory device 100 may be arranged in the memory cell array 110. The memory cells of the memory cell array 110 may be grouped into a plurality of memory blocks BLK1 to BLKz. The plurality of memory blocks BLK1 to BLKz may be coupled to the address decoder 120 through word lines WL. The memory blocks BLK1 to BLKz may also be coupled to the read and write circuit 130 through bit lines BL1 to BLm. Each of the memory blocks BLK1 to BLKz includes a plurality of memory cells. In an embodiment, the plurality of memory cells may be nonvolatile memory cells. A plurality of memory cells coupled in common to a single word line may be defined as one page. Furthermore, each memory block includes a plurality of pages.

The program operation of the semiconductor memory device 100 may be performed on a page basis. Each of the memory blocks BLK1 to BLKz of the memory cell array 110 may include a plurality of memory cell strings. Each of the memory cell strings may include a plurality of memory cells. For example, each of the memory cell strings may include a plurality of memory cells vertically stacked on the semiconductor substrate. Each of the memory cell strings may include one or more drain select transistors, a plurality of memory cells, and one or more source select transistors, which are coupled between a bit line BL and a source line SL.

The address decoder 120, the read/write circuit 130, and the voltage generation circuit 150 are operated as peripheral circuits for driving the memory cell array 110.

The address decoder 120 may be coupled to the memory cell array 110 through the word lines WL. The address decoder 120 may operate in response to control signals provided by the control logic 140. The semiconductor memory device 100 may further include an input/output buffer (not illustrated). The address decoder 120 receives addresses ADDR through the input/output buffer. The address ADDR may include a block address that is used to select one or more of the memory blocks BLK1 to BLKz of the memory cell array 110. The address decoder 120 may decode the address ADDR to obtain a row address. During a program operation, the address decoder 120 may apply program voltages Vpgm, pass voltages Vpass, and operation voltages, which are generated by the voltage generation circuit 150, to a plurality of memory cells, the one or more drain select transistors, and the one or more source select transistors of the memory cell array 110 in response to the row address obtained from the received addresses ADDR. The address decoder 120 may also decode the address ADDR to obtain a column address Yi. The address decoder 120 may transmit the column address Yi to the read/write circuit 130.

Addresses ADDR received to perform a program operation may include a block address, a row address, and a column address Yi. The address decoder 120 may select one memory block and one word line in accordance with the block address and the row address. The column address Yi may be obtained by decoding the addresses ADDR at the address decoder 120, and may be provided to the read and write circuit 130.

The address decoder 120 may include a block decoder, a row decoder, a column decoder, an address buffer, etc.

The read and write circuit 130 may include a plurality of page buffers PB1 to PBm. The plurality of page buffers PB1 to PBm may be coupled to the memory cell array 110 through the bit lines BL1 to BLm. The page buffers PB1 to PBm may receive data DATA to be written during a program operation, and may temporarily store it. The page buffers PB1 to PBm may control, using a program allowable voltage or a program inhibit voltage, a potential of a corresponding one of the bit lines BL1 to BLm in accordance with the data DATA. Furthermore, the page buffers PB1 to PBm may sense a program state of a corresponding memory cell during a program verification operation, compare it with the data DATA, which is desired to be written and temporarily stored in the page buffers PB1 to PBm, and verify whether the corresponding memory cell has been completely programmed.

The read/write circuit 130 may operate in response to control signals provided by the control logic 140. In an embodiment, the read/write circuit 130 may include page buffers (or page resistors), a row select circuit, etc.

The control logic 140 may be coupled to the address decoder 120, the read/write circuit 130, and the voltage generation circuit 150. The control logic 140 may receive a command CMD through an input/output buffer (not illustrated) of the semiconductor memory device 100. The control logic 140 may control the overall operation of the semiconductor memory device 100 in response to the command CMD.

During a program operation, the control logic 140 according to an embodiment may control the voltage generation circuit 150 to apply program voltages Vpgm a page selected from the plurality of pages, each including the plurality of memory cells stacked along the vertical plug on the semiconductor substrate. In an embodiment, the program voltages Vpgm may be incremental step pulse gradually increasing by a first step voltage. During the program operation, the control logic 140 may also control the voltage generation circuit 150 to apply pass voltages Vpass to unselected pages. In an embodiment, the pass voltages Vpass may gradually increase by a second step voltage, and the second step voltages may vary depending on where the memory cells of the unselected pages are.

For example, the second step voltages of the pass voltages Vpass applied to the unselected pages may be determined (e.g., whether to maintain/increase/decrease the pass voltages) depending on the position of the vertical plug on the semiconductor substrate.

In an embodiment, the second step voltages of the pass voltages Vpass applied to the unselected pages may be adjusted depending on the width of the vertical plug on the semiconductor substrate. Here, the smaller the width of the vertical plug, the smaller the second step voltage by which the pass voltages Vpass increase would be. If the memory cells of unselected pages are disposed where the vertical plug is relatively wide, the voltage generation circuit 150 may increase the pass voltages Vpass to be applied to the memory cells of the unselected pages by relatively high second step voltage, and if the memory cells of unselected pages are disposed where the vertical plug is relatively narrow, the voltage generation circuit 150 may increase the pass voltages Vpass to be applied to the memory cells of the unselected pages by relatively low second step voltage. In an embodiment, if the memory cells of unselected pages are disposed where the vertical plug is relatively narrow, the second step voltages of the pass voltages Vpass applied to the unselected pages are gradually reduced. As a result, the last pass voltages Vpass applied to a large-plug-width region may be higher than the last pass voltages Vpass applied to a small-plug-width region.

In an embodiment, the plurality of pages may be divided into a plurality of groups, and the control logic 140 may control the voltage generation circuit 150 such that second step voltages of pass voltages Vpass applied to different groups are different from each other. For example, when pass voltages Vpass are applied to groups disposed where the vertical plug is relatively narrow, the second step voltages of the pass voltages Vpass may be smaller than those applied to groups disposed where the vertical plug is relatively wide. Moreover, in an embodiment, when pass voltages Vpass are applied to groups disposed where the vertical plug is relatively narrow, the second step voltages of the pass voltages Vpass may be gradually reduced. As a result, the last pass voltages Vpass applied to a page group of a large-plug-width region may be higher than the last pass voltages Vpass applied to a page group of a small-plug-width region.

In an embodiment, each of the second step voltages of the pass voltages Vpass applied to the respective unselected pages may be constant regardless of how many times the pass voltages Vpass are applied. Alternatively, each of the second step voltages of the pass voltages Vpass applied to the respective unselected pages may be increased or reduced as the number of iterations of applying the pass voltages Vpass to the unselected pages.

In an embodiment, the first pass voltages Vpass applied to different regions of unselected memory cells may be identical to each other. Alternatively, the first pass voltages Vpass applied to different regions of unselected pages may vary depending on where unselected pages are located (e.g., depending on whether they are in the large-plug-width region or in the small-plug-width region).

Further, in an embodiment, when pass voltages Vpass are applied to unselected pages adjacent to the selected page, the second step voltages thereof may be equal to or greater than second step voltages of pass voltages Vpass applied to the remaining unselected pages other than the unselected pages adjacent to the selected page. In this regard, the control logic 140 may control the voltage generation circuit 150 such that a difference value between the first step voltage of the program voltages Vpgm and the second step voltages of the pass voltages Vpass applied to the unselected pages adjacent to the selected page is less than or equal to a preset value.

During a program operation, the voltage generation circuit 150 may generate program voltages Vpgm, pass voltages Vpass, and a plurality of operating voltages under the control of the control logic 140. The plurality of operating voltages may include a pipe transistor operating voltage.

Figure 2:
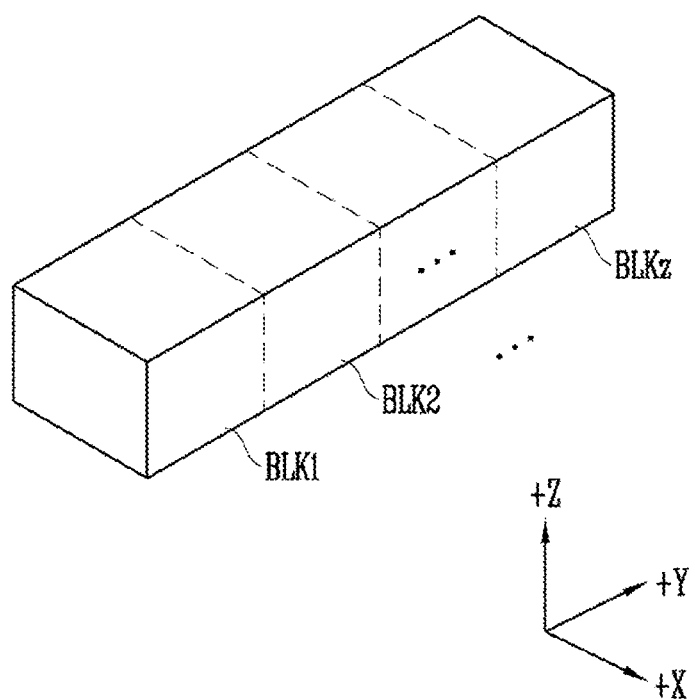
FIG. 2 is a diagram illustrating an example configuration of a memory cell array of FIG. 1.

FIG. 2 is a diagram illustrating an example configuration of the memory cell array of FIG. 1.

Referring to FIG. 2, the memory cell array 110 may include the plurality of memory blocks BLK1 to BLKz. Each memory block may have a three-dimensional structure. Each memory block may include a plurality of memory cells stacked along the vertical plug on the semiconductor substrate. The memory cells may be arranged in +X, +Y, and +Z directions.

Figure 3:
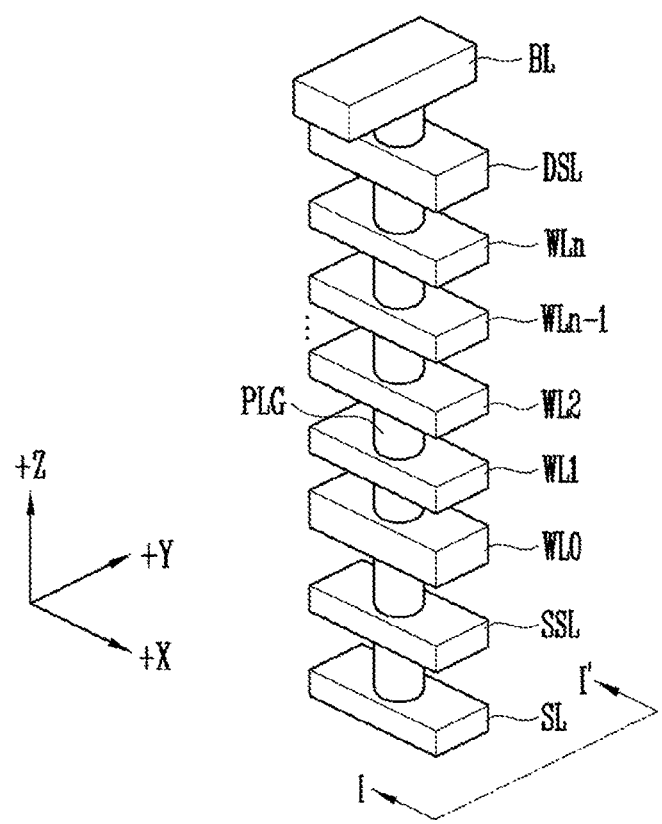
FIG. 3 is a perspective view illustrating an example of a memory cell string included in the memory blocks of FIG. 2.

FIG. 3 is a perspective view illustrating an example of a memory cell string included in the memory blocks of FIG.

Figure 4:
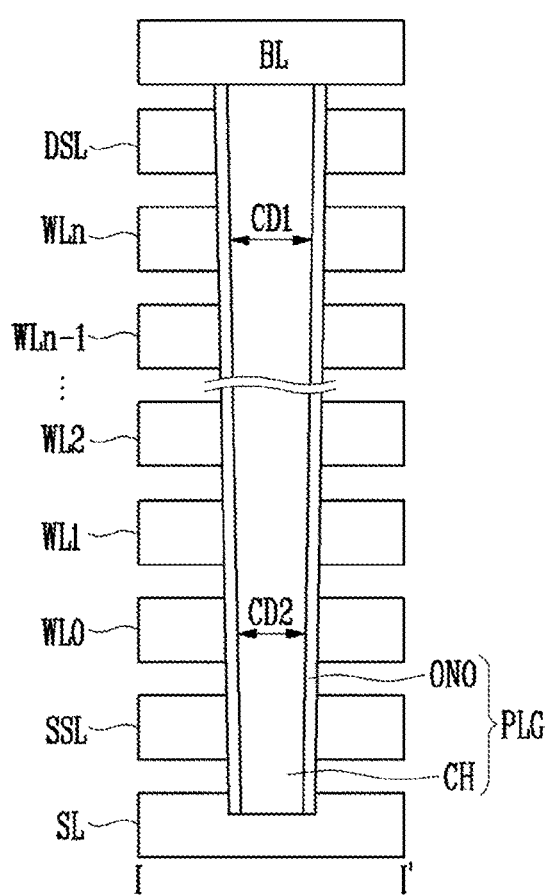
FIG. 4 is a cross-sectional view illustrating an example structure of the memory cell string of FIG. 3.

2, and FIG. 4 is a cross-sectional view illustrating an example structure of the memory cell string of FIG. 3.

FIG. 3 illustrates a memory cell string having a three-dimensional structure with respect to the +X, +Y, and +Z directions, and FIG. 4 illustrates a cross section of the cell string of FIG. 3 formed by a plane perpendicular to a line I-I'.

Referring to FIGS. 3 and 4, a common source line SL may be formed on the semiconductor substrate. A source select line SSL, word lines WL0 to WLn, a drain select line DSL and a bit line BL, which are sequentially stacked and spaced apart from each other, may be formed over the common source line SL. A plug PLG, which vertically passes through the source select line SSL, the word lines WL0 to WLn and the drain select line DSL, may be formed between the common source line SL and the bit line BL. An upper end of the plug PLG may be coupled to the bit line BL, and a lower end thereof may be coupled to the common source line SL. The plug PLG may be configured with a cylindrical channel layer CH and a cylindrical memory layer ONO. For example, the channel layer CH may be formed in the cylindrical memory layer ONO. The word lines WL0 to WLn and the memory layer ONO coupled thereto may constitute a memory cell.

The plug PLG may be formed in such a way that a vertical plug hole vertically passing through the common source line SL, the source select line SSL, the word lines WL0 to WLn and the drain select line DSL is formed and then the vertical plug hole is filled with the memory layer ONO and the channel layer CH. The vertical plug hole may have a constant width regardless of the depth, but due to manufacturing process variations the vertical plug hole may taper as it extends downwardly. That is, the width of the vertical plug hole is greatest at its top end and smallest at its bottom end. For example, suppose that the width of an upper portion of the plug PLG is a first width CD1 and the width of a lower portion of the plug PLG is a second width CD2. In this example, the second width CD2 may be narrower than the first width CD1. Here, the first and second widths CD1 and CD2 are relative, and do not indicate the widths at particular positions on the plug PLG. That is, if the width at a certain position on the plug PLG is the first width CD1, the width at a position lower than the certain position is the second width CD2. As such, the width of the plug PLG may vary depending on the position. As a result, memory cells programmed by an identical program voltage may have different threshold voltages depending on the positions of the memory cells. For instance, a program operation for memory cells formed at the small-plug-width region of the plug PLG may proceed more rapidly than that of memory cells formed at the large-plug-width region of the plug PLG. That is, the memory cells formed at the small-plug-width region of the plug PLG may be called "fast" cells.

Figure 5:
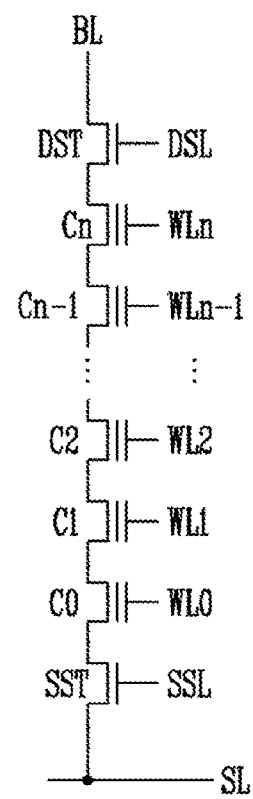
FIG. 5 is a diagram illustrating an example of the memory cell string of FIG. 3.

FIG. 5 is a diagram illustrating an example of the memory cell string of FIG. 3.

Referring to FIG. 5, the memory cell string may be vertically coupled between the common source line SL and the bit line BL, and may include the source select transistor SST, the memory cells C0 to Cn, and the drain select transistor DST. The source select transistor SST and the drain select transistor DST may be respectively coupled to the source select line SSL and the drain select line DSL. The memory cells C0 to Cn may be respectively coupled to the word lines WL0 to WLn. The memory cells C0 to Cn coupled to different word lines WL0 to WLn may be included in different pages.

Figure 6:
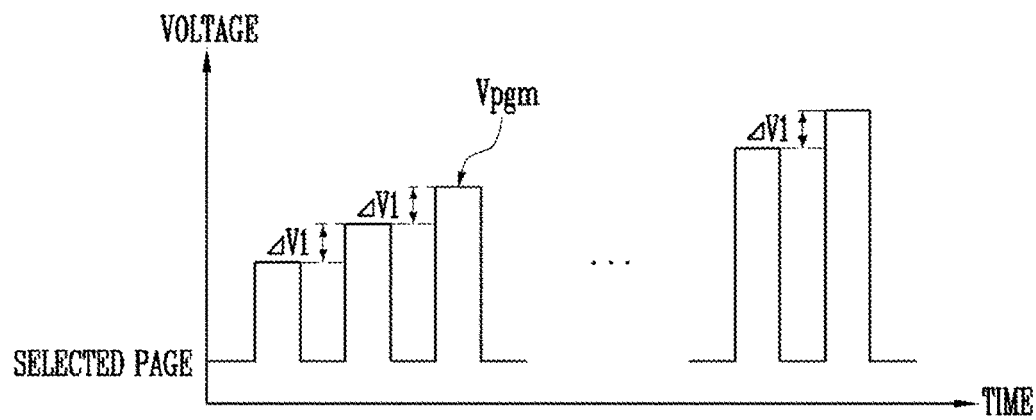
FIG. 6 illustrates example waveform diagrams of program voltages and pass voltages according to an embodiment of the present disclosure.
Figure 6:
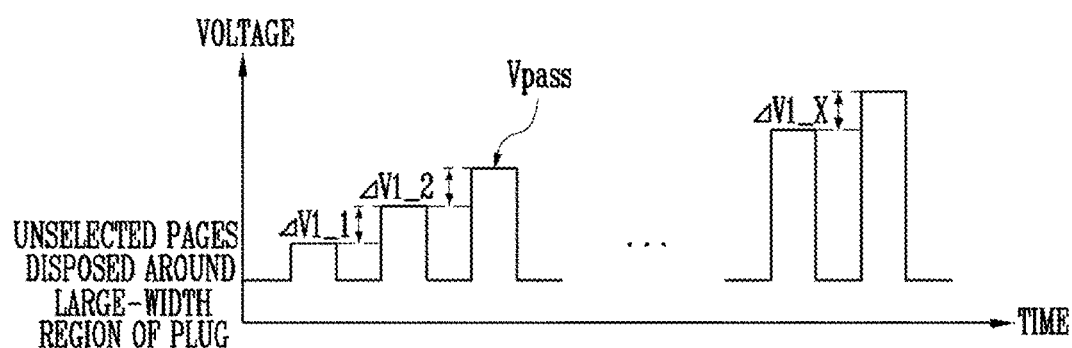
Figure 6:
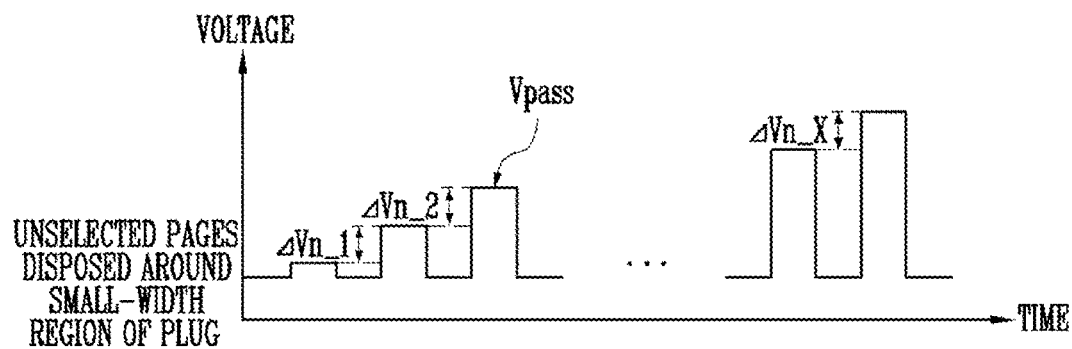

FIG. 6 illustrates example waveform diagrams of program voltages and pass voltages according to an embodiment of the present disclosure.

Referring to FIGS. 3 to 6, the program operation may be performed sequentially on a page basis. For example, a plurality of memory cells including the memory cell C0 coupled to the word line WL0 may be defined as a first page, and a plurality of memory cells including the memory cell Cn coupled to the word line WLn may be defined as a last page.

When a program voltage Vpgm is applied to a selected word line coupled to memory cells of a selected page, pass voltages Vpass may be applied to unselected word lines coupled to memory cells of unselected pages.

In an Incremental Step Pulse Program (ISPP), the program voltage Vpgm may increase by a first step voltage ($\Delta V1$) as the number of iterations of program loops is increased.

During the program operation, pass voltages Vpass applied to the unselected word lines may increase by second step voltages as the number of iterations of program loops is increased. The second step voltages may be maintained constant, or may be increased or reduced depending on the positions of the unselected word lines.

In more detail, the second step voltages of the pass voltages Vpass applied to the memory cells of the unselected pages may be maintained constant, or may be increased or reduced depending on the width of the plug PLG. Pass voltages Vpass gradually increasing by second step voltages $\Delta V1\_1$ to $\Delta V1\_X$ for the large-plug-width region may be applied to an unselected page if memory cells of the unselected page are in the large-plug-width region of the plug PLG. Each of the second step voltages $\Delta V1\_1$ to $\Delta V1\_X$ may be constant regardless of the number of iterations of applying pass voltages Vpass, or may be increased or reduced as the number of application of pass voltages Vpass is increased. Pass voltages Vpass gradually increasing by second step voltages $\Delta Vn\_1$ to $\Delta Vn\_X$ for the small-plug-width region may be applied to an unselected page if memory cells of the unselected page are in the small-plug-width region of the plug PLG. Each of the second step voltages $\Delta Vn\_1$ to $\Delta Vn\_X$ may be constant regardless of the number of application of pass voltages Vpass, or may be increased or reduced as the number of iterations of applying the pass voltages Vpass is increased.

The second step voltages of the pass voltages Vpass applied to the unselected pages in the large-plug-width region may be larger than the second step voltages of the pass voltages Vpass applied to the unselected pages in the small-plug-width region. For example, the smaller the width of the plug PLG, the smaller the second step voltage by which the pass voltages Vpass increase would be. For example, pass voltages Vpass gradually increasing by second step voltages $\Delta V1\_1$ to $\Delta V1\_X$ for the large-plug-width region may be applied to, among the unselected pages, a page including the memory cell Cn. Pass voltages Vpass gradually increasing by second step voltages $\Delta Vn\_1$ to $\Delta Vn\_X$ for the small-plug-width region may be applied to, among the unselected pages, a page including the memory cell C0. In an embodiment, the second step voltages of the pass voltage Vpass applied to the unselected pages may be gradually reduced. As a result, the last pass voltage Vpass applied to the unselected page in the small-plug-width region may be lower than the last pass voltage Vpass applied to the unselected page in the large-plug-width region.

Furthermore, among the pass voltages Vpass applied to the unselected pages, the first (start) pass voltages may be equal to each other. Alternatively, the first (start) pass voltages may vary depending on whether the unselected pages are in the small-plug-width region or in the large-plug-width region.

Figure 7:
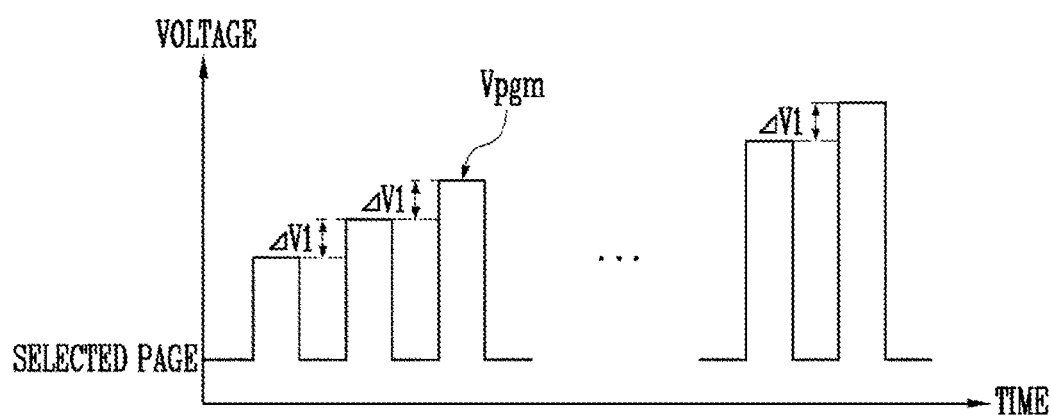
FIG. 7 illustrates example waveform diagrams of program voltages and pass voltages according to an embodiment of the present disclosure.
Figure 7:
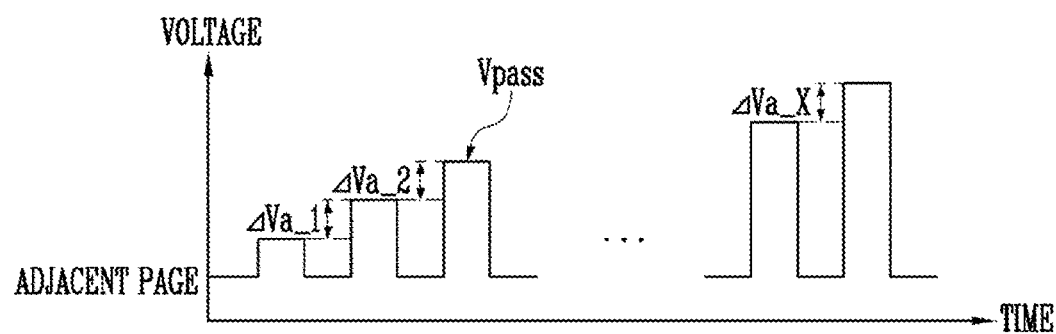

FIG. 7 illustrates example waveform diagrams of program voltages and pass voltages according to an embodiment of the present disclosure.

Referring to FIGS. 3 to 5 and 7, a program operation is performed sequentially, page by page, on a plurality of memory cells C0 to Cn vertically stacked on the semiconductor substrate. For example, a plurality of memory cells including the memory cell C0 coupled to the word line WL0 may be defined as a first page, and a plurality of memory cells including the memory cell Cn coupled to the word line WLn may be defined as a last page.

Program voltages Vpgm gradually increasing by a first step voltage $\Delta V1$ may be applied to a selected page among the plurality of pages.

The second step voltages $\Delta Va\_1$ to $\Delta Va\_X$ of pass voltages Vpass applied to pages adjacent to the selected page may be equal to or greater than second step voltages of pass voltages Vpass applied to the remaining unselected pages other than the unselected pages adjacent to the selected page. Each of the second step voltages $\Delta Va\_1$ to $\Delta Va\_X$ of the pass voltages Vpass applied to the unselected pages adjacent to the selected page may be constant regardless of the number of iterations of applying the pass voltages Vpass or may be increased or reduced in proportion to the number of iterations of applying the pass voltages Vpass.

For example, when, among the plurality of pages, a page including the memory cell C1 is selected and program voltages Vpgm gradually increasing by the first step voltage $\Delta V1$ is applied to the page, pass voltages Vpass gradually increasing by the second step voltages $\Delta Va\_1$ to $\Delta Va\_X$ may be applied to pages respectively including the memory cell C0 and the memory cell C2 that are adjacent to the memory cell C1. Here, a difference value between the first step voltage $\Delta V1$ of the program voltages Vpgm applied to the selected page and the second step voltages $\Delta Va\_1$ to $\Delta Va\_X$ of the pass voltages Vpass applied to the unselected pages adjacent to the selected page may be set to be less than or equal to a preset value. For example, a difference value between the first step voltage $\Delta V1$ of the program voltages Vpgm applied to the selected page and the second step voltage $\Delta Va\_2$ of the pass voltages Vpass applied to the unselected pages adjacent to the selected page may be set to be less than or equal to a preset value. The second step voltages of the pass voltages Vpass applied to the remaining unselected pages other than the unselected pages adjacent to the selected page may be adjusted depending on the position of the plug PLG or the width of the plug PLG, as described with reference to FIG. 6.

Figure 8:
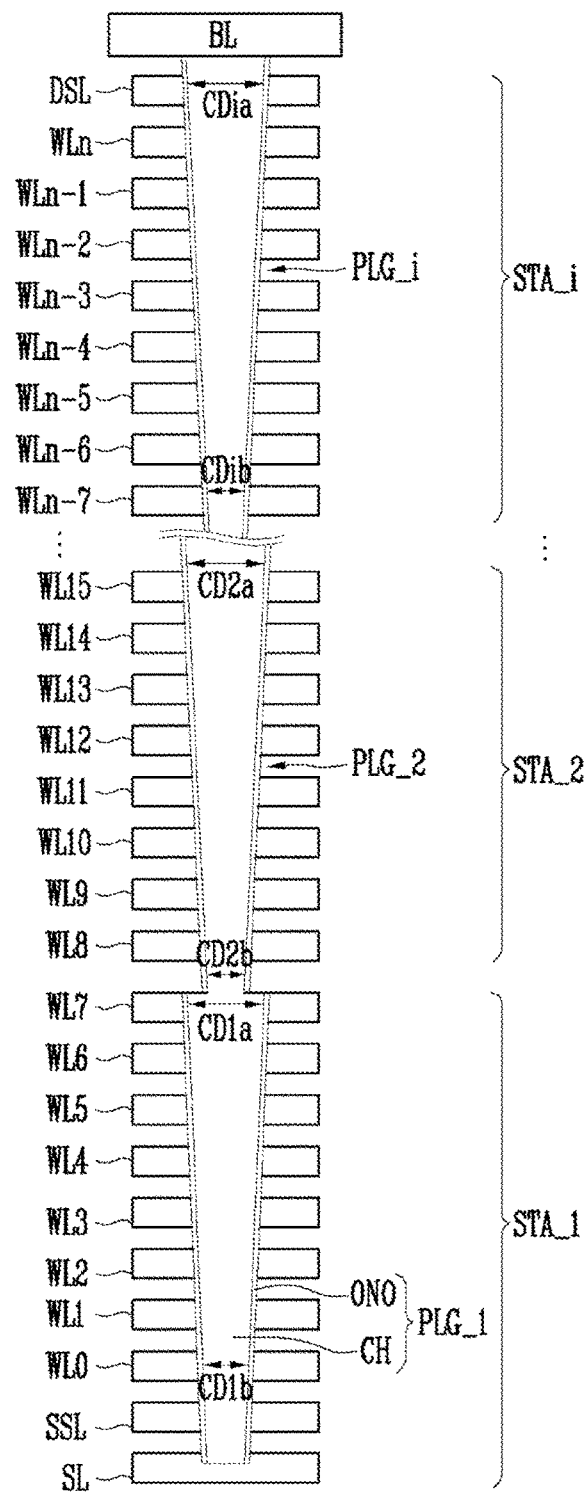
FIG. 8 is a cross-sectional view illustrating an example of the memory cell strings of FIG. 3 having a multi-stack structure.

FIG. 8 is a cross-sectional view illustrating an example of the memory cell strings of FIG. 3 having a multi-stack structure.

Referring to FIG. 8, a command source line SL and a bit line BL may be formed over the semiconductor substrate. The multi-stack structure may include a plurality of stacks STA_1 to STA_i stacked on top of one another and disposed between the command source line SL and the bit line BL. The multi-stack structure may include a plurality of conductive layers SSL, WL0 to WLn, and DSL and a plurality of plugs PLG_1 to PLG_i. Among the plurality of conductive layers SSL, WL0 to WLn, and DSL, the lowermost conductive layer may form a source select line SSL, and the uppermost conductive layer may form a drain select line DSL. The conductive layers disposed between the source select line SSL and the drain select line DSL may form word lines WL0 to WLn. The plurality of conductive layers SSL, WL0 to WLn, and DSL may enclose the plurality of plugs PLG_1 to PLG_i at different heights. Each of the plugs PLG_1 to PLG_i may be configured with a channel layer CH and a memory layer ONO. The surface of the channel layer CH may be enclosed by the memory layer ONO. For example, the word line WL0, and the memory layer ONO and channel layer CH that correspond to the word line WL0 may constitute a memory cell.

Each of the stacks STA_1 to STA_i may include a plurality of plugs PLG_1 to PLG_i. Here, the widths of upper regions CD1a to CDia of the plugs PLG_1 to PLG_i may be larger than the widths of lower regions CD1b to CDib of the plugs PLG_1 to PLG_i. The plugs PLG_1 to PLG_i may be coupled to each other.

Although FIG. 8 illustrates that each stack of the multi-stack structure has eight word lines, the present disclosure is not limited thereto.

Figure 9:
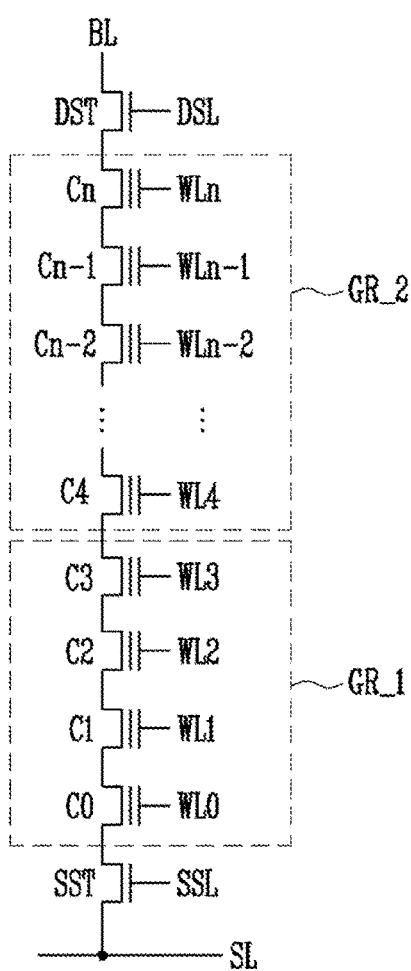
FIG. 9 is a diagram for describing an example of an operating method of a semiconductor memory device having the memory cell string of FIG. 5 that is divided into two groups.

FIG. 9 is a diagram for describing an example of an operating method of a semiconductor memory device having the memory cell string of FIG. 5 that is divided into two groups.

Referring to FIGS. 3 to 7 and 9, the memory cell string may be vertically coupled between the common source line SL and the bit line BL, and may include the source select transistor SST, the memory cells C0 to Cn, and the drain select transistor DST. The source select line SSL and the drain select line DSL may be respectively coupled to the source select transistor SST and the drain select transistor DST. The word lines WL0 to WLn may be respectively coupled to the memory cells C0 to Cn. The memory cells C0 to Cn coupled to different word lines WL0 to WLn may be included in different pages. For example, a plurality of memory cells that are coupled to the same word line and coupled to different cell strings may be defined as one page. The program operation may be performed sequentially on a page basis.

The memory cell string may be divided into two groups. For example, memory cells C0 to C3 coupled to word lines WL0 to WL3 may be included in a first group GR_1, and memory cells C4 to Cn coupled to word lines WL4 to WLn may be included in a second group GR_2. The number of memory cells coupled to the word lines included in each group may vary.

The second step voltages of pass voltages Vpass applied to each of the first and second groups GR_1 and GR_2 including unselected pages may be different from each other. For example, the second step voltages of the pass voltages Vpass applied to the first group GR_1 disposed where the plug PLG is relatively narrow may be low compared to the second step voltages of the pass voltages Vpass applied to the second group GR_2 disposed where the plug PLG is relatively wide. Thus, the last pass voltages Vpass applied to the first group GR_1 may be lower than the last pass voltages Vpass applied to the second group GR_2. Here, each of the second step voltages of the pass voltages Vpass applied to the respective unselected pages included in the first and second groups GR_1 and GR_2 may be constant regardless of the number of iterations of applying the pass voltages Vpass, or may be increased or reduced as the number of iterations of application is increased. Furthermore, among the pass voltages Vpass applied to the unselected pages included in the first and second groups GR_1 and GR_2, the first (start) pass voltages may be equal to each other. Alternatively, the first (start) pass voltages may different from each other. Furthermore, second step voltages ΔVa_1 to ΔVa_X of pass voltages Vpass that are applied to, among the unselected pages included in the first and second groups GR_1 and GR_2, unselected pages disposed adjacent to a selected page may be equal to or larger than second step voltages of pass voltages Vpass applied to remaining unselected pages other than the unselected pages adjacent to the selected page. Here, a difference value between the first step voltage ΔV1 of the program voltages applied to the selected page and the second step voltages ΔVa_1 to ΔVa_X of the pass voltages Vpass applied to the unselected pages adjacent to the selected page may be less than or equal to a preset value.

Figure 10:
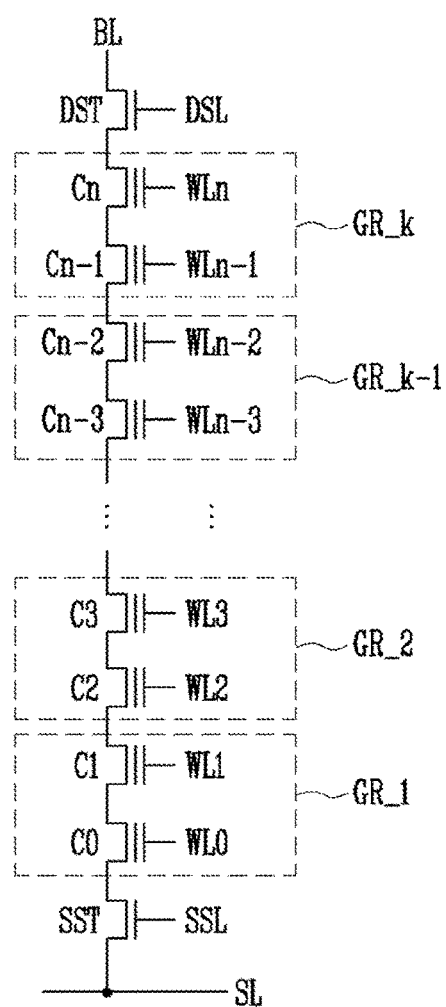
FIG. 10 is a diagram for describing an example of an operating method of a semiconductor memory device having the memory cell string of FIG. 5 that is divided into a plurality of groups.

FIG. 10 is a diagram for describing an example of an operating method of a semiconductor memory device having the memory cell string of FIG. 5 that is divided into a plurality of groups.

Referring to FIGS. 3 to 7 and 10, the memory cell string may be vertically coupled between the common source line SL and the bit line BL, and may include the source select transistor SST, the memory cells C0 to Cn, and the drain select transistor DST. The source select transistor SST and the drain select transistor DST may be respectively coupled to the source select line SSL and the drain select line DSL. The word lines WL0 to WLn may be respectively coupled to the memory cells C0 to Cn. A plurality of memory cells including the memory cells C0 to Cn may be included in different pages. A program operation for the plurality of memory cells including the memory cells C0 to Cn may be performed sequentially on a page basis. For example, a plurality of memory cells including the memory cell C0 coupled to the word line WL0 may be defined as one page. The memory cell string may be divided into a plurality of groups GR_1 to GR_k. For example, the memory cell C0 and the memory cell C1 that are respectively coupled to the word line WL0 and the word line WL1 may be included in the first group GR_1, and the memory cell C2 and the memory cell C3 that are respectively coupled to the word line WL2 and the word line WL3 may be included in the second group GR_2. Furthermore, the memory cell Cn-2 and the memory cell Cn-3 that are respectively coupled to the word line WLn-2 and the word line WLn-3 may be included in the (k−1)$^{th}$ group GR_k-1, and the memory cell Cn and the memory cell Cn-1 that are respectively coupled to the word line WLn and the word line WLn-1 may be included in the k$^{th}$ group GR_k. Here, the number of memory cells included in a single group is not limited to that of FIG. 10.

According to an embodiment of the present disclosure, second step voltages of pass voltages Vpass applied to unselected pages included in the respective groups GR_1 to GR_k may be different from each other. For example, the second step voltages of the pass voltages Vpass applied to the k$^{th}$ group GR_k disposed in the large-plug-width region of the plug PLG may be larger than the second step voltages of the pass voltages Vpass applied to the first group GR_1 disposed in the small-plug-width region of the plug PLG. For example, the smaller the width of the plug PLG, the smaller the second step voltage by which the pass voltages Vpass increase would be. In an embodiment, the second step voltages of the pass voltages Vpass applied to the respective groups GR_1 to GR_k may be gradually reduced. As a result, the last pass voltages Vpass applied to the k$^{th}$ group GR_k may be higher than the last pass voltages Vpass applied to the first group GR_1. Each of the second step voltages of the pass voltages Vpass applied to the respective unselected pages included in the groups GR_1 to GR_k may be constant regardless of the number of iterations of applying the pass voltages Vpass, or may be increased or reduced as the number of application is increased. Furthermore, among the pass voltages Vpass applied to the unselected pages included in the groups GR_1 to GR_k, the first (start) pass voltages may be equal to each other. Alternatively, the first (start) pass voltages may be different from each other. In addition, second step voltages ΔVa_1 to ΔVa_X of pass voltages Vpass that are applied to, among the unselected pages included in the groups GR_1 to GR_k, unselected pages disposed adjacent to a selected page may be equal to or larger than second step voltages of pass voltages Vpass applied to remaining unselected pages other than the unselected pages adjacent to the selected page. Here, a difference value between the first step voltage ΔV1 of the program voltages applied to the selected page and the second step voltages ΔVa_1 to ΔVa_X of the pass voltages Vpass applied to the unselected pages adjacent to the selected page may be less than or equal to a preset value.

Figure 11:
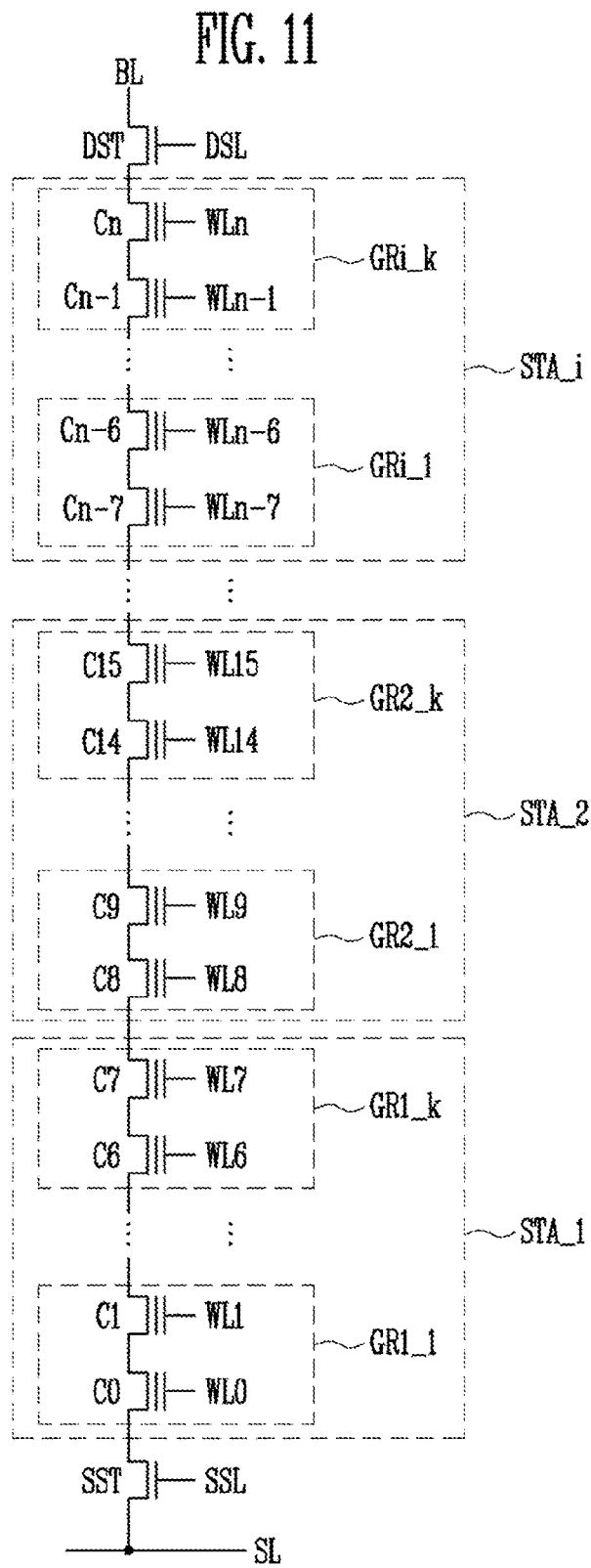
FIG. 11 is a diagram for describing an example of an operating method of a semiconductor memory device having the memory cell string of FIG. 8 that is divided into a plurality of groups.

FIG. 11 is a diagram for describing an example of an operating method of a semiconductor memory device having the memory cell string of FIG. 8 that is divided into a plurality of groups.

Referring to FIGS. 6 to 8 and 11, the memory cell string may be coupled between the common source line SL and the bit line BL, and may include the source select transistor SST, the memory cells C0 to Cn, and the drain select transistor DST. The source select transistor SST and the drain select transistor DST may be respectively coupled to the source select line SSL and the drain select line DSL, and the word lines WL0 to WLn may be respectively coupled to the memory cells C0 to Cn. A plurality of memory cells including the memory cells C0 to Cn may be included in different pages. The cell string may be divided into a plurality of single stacks STA_1 to STA_i. Each of the stacks STA_1 to STA_i may be divided into a plurality of groups. For example, a stack STA_1 may include a plurality of groups GR1_1 to GR1_k. Here, the memory cell C0 and the memory cell C1 that are respectively coupled to the word line WL0 and the word line WL1 may be included in the first group GR1_1, and the memory cell C6 and the memory cell C7 that are respectively coupled to the word line WL6 and the word line WL7 may be included in the group GR1_k. The single stack STA_2 may include a plurality of groups GR2_1 to GR2_k. The memory cell C8 and the memory cell C9 that are respectively coupled to the word line WL8 and the word line WL9 may be included in the group GR2_1, and the memory cell C14 and the memory cell C15 that are respectively coupled to the word line WL14 and the word line WL15 may be included in the group GR2_k. The single stack STA_i may include a plurality of groups GRi_1 to GRi_k. The memory cell Cn-7 and the memory cell Cn-6 that are respectively coupled to the word line WLn-7 and the word line WLn-6 may be included in the group GRi-1, and the memory cell Cn-1 and the memory cell Cn that are respectively coupled to the word line WLn-1 and the word line WLn may be included in the group GRi_k. Here, the number of memory cells included in the respective groups is not limited to that of FIG. 11.

According to an embodiment of the present disclosure, second step voltages of pass voltages Vpass applied to the respective groups included in the respective stacks STA_1 to STA_i may be different from each other. For example, the second step voltages of the pass voltages Vpass applied to the group GR1_k of the stack STA_1 disposed in the large-plug-width region of the plug may be larger than the second step voltages of the pass voltages Vpass applied to the group GR1_1 of the stack STA_1 disposed in the small-plug-width region of the plug. Likewise, the second step voltages of the pass voltages Vpass applied to the group GR2_k of the stack STA_2 disposed in the large-plug-width region of the plug may be larger than the second step voltages of the pass voltages Vpass applied to the group GR2_1 of the stack STA_2 disposed in the small-plug-width region of the plug. In addition, the second step voltages of the pass voltages Vpass applied to the group GRi_k of the stack STA_i disposed in the large-plug-width region of the plug may be larger than the second step voltages of the pass voltages Vpass applied to the group GRi_1 of the stack STA_i disposed in the small-plug-width region of the plug. For example, the smaller the width of the plug, the smaller the second step voltage by which the pass voltages Vpass increase would be. That is, the second step voltages of the pass voltages Vpass applied to the groups included in each stack STA_1 to STA_i may vary depending on where the group is between the large-plug-width region and the small-plug-width region. In an embodiment, the second step voltages of the pass voltages Vpass applied to the respective groups GRi_1 to GRi_k may be gradually reduced. As a result, the last pass voltage Vpass applied to the groups in the small-plug-width region of each stack STA_1 to STA_i may be lower than the last pass voltage Vpass applied to groups in the large-plug-width region of each stack STA_1 to STA_i. Each of the second step voltages of the pass voltages Vpass applied to the respective unselected pages included in the groups may be constant regardless of the number of iterations of applying the pass voltages Vpass, or may be increased or reduced as the number of application is increased. Furthermore, among the pass voltages Vpass applied to the unselected pages included in the groups, the first (start) pass voltages may be equal to each other. Alternatively, the first (start) pass voltages may vary depending on whether the unselected pages are in the small-plug-width region or in the large-plug-width region. In addition, second step voltages $\Delta Va\_1$ to $\Delta Va\_X$ of pass voltages Vpass that are applied to, among the unselected pages included in the groups, unselected pages disposed adjacent to a selected page may be equal to or larger than second step voltages of pass voltages Vpass applied to remaining unselected pages other than the unselected pages adjacent to the selected page. Here, a difference value between the first step voltage $\Delta V1$ of the program voltages applied to the selected page and the second step voltages $\Delta Va\_1$ to $\Delta Va\_X$ of the pass voltages Vpass applied to the unselected pages adjacent to the selected page may be less than or equal to a preset value.

Figure 12:
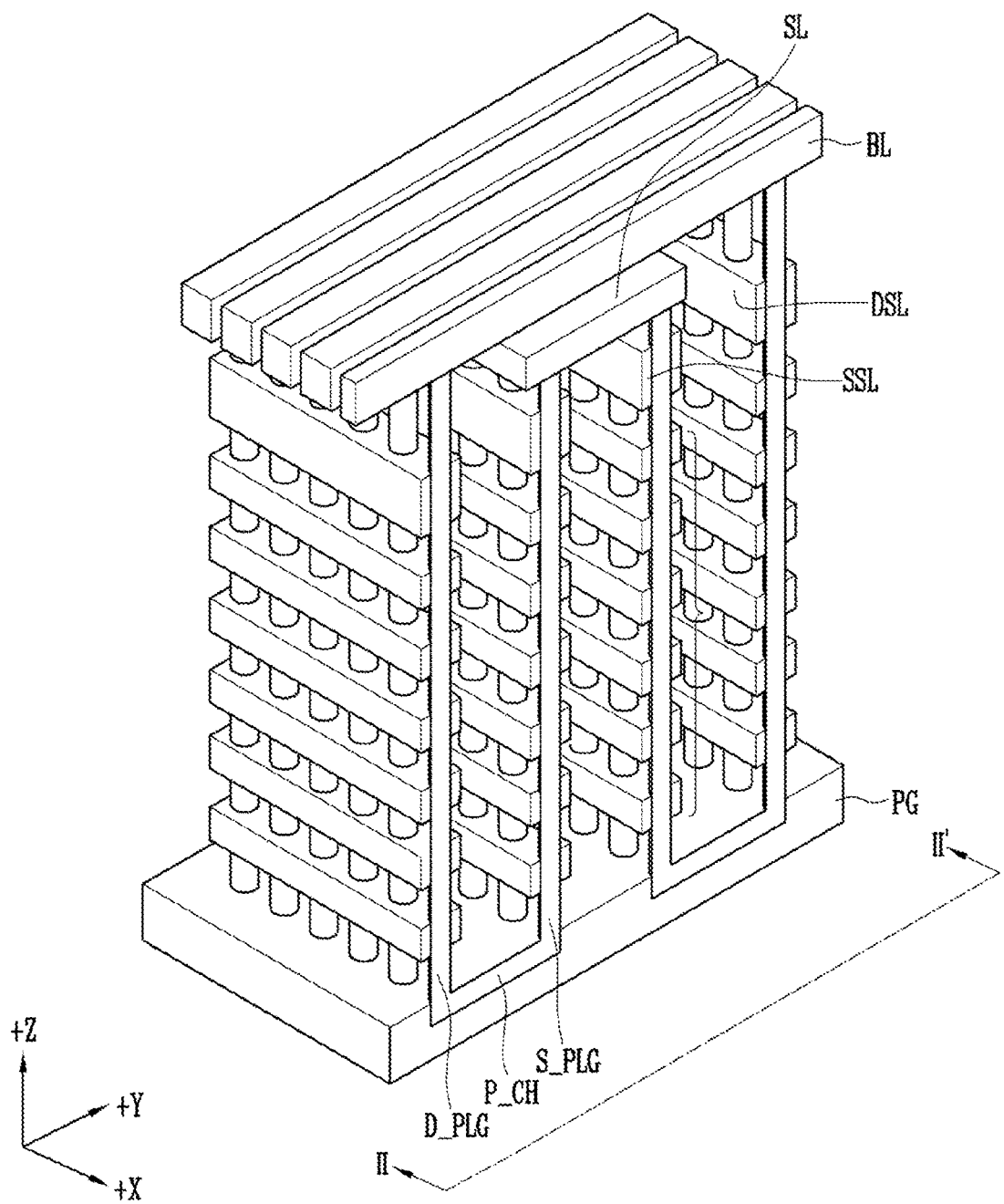
FIG. 12 is a perspective view illustrating an example of a memory cell string included in the memory blocks of FIG. 2.
Figure 13:
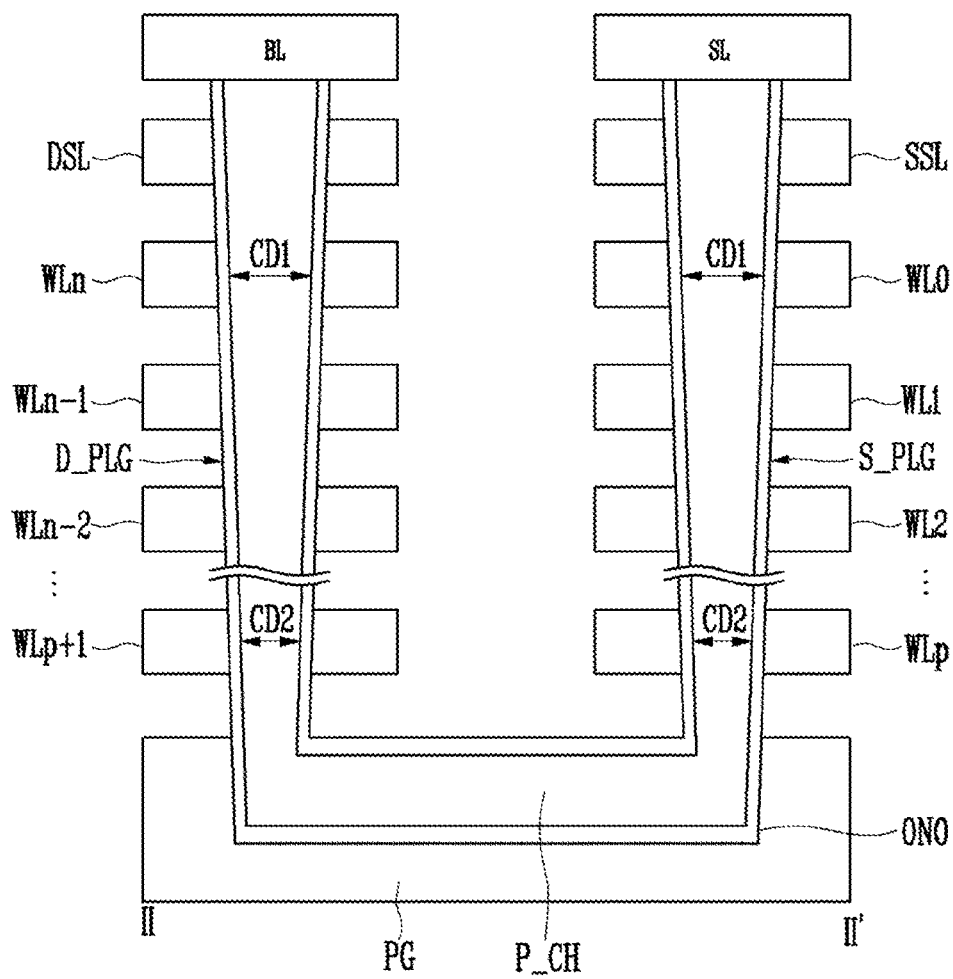
FIG. 13 is a cross-sectional view illustrating an example structure of the memory cell string of FIG. 12.

FIG. 12 is a perspective view illustrating an example of a memory cell string included in the memory blocks of FIG. 2, and FIG. 13 is a cross-sectional view illustrating an example structure of the memory cell string of FIG. 12. Here, interlayer insulating layers have been omitted from the drawing for the sake of clarity.

FIG. 12 illustrates a memory cell string having a three-dimensional structure with respect to the +X, +Y, and +Z directions, and FIG. 13 illustrates a cross section of the cell string of FIG. 12 formed by a plane perpendicular to a line II-II'.

Referring to FIGS. 12 and 13, a memory block may include a U-shaped plug. The U-shaped plug may include a pipe channel layer P_CH formed in a pipe gate PG, and a pair of source side plug S_PLG and drain side plug D_PLG which are coupled with the pipe channel layer P_CH. An upper end of the source side plug S_PLG may be coupled to the common source line SL. A lower end of the source side plug S_PLG may be coupled to the pipe channel layer P_CH. An upper end of the drain side plug D_PLG may be coupled to the bit line BL. A lower end of the drain side plug D_PLG may be coupled to the pipe channel layer P_CH.

A plurality of source side conductive layers SSL and WL0 to WLp may enclose the source side plug S_PLG at different heights on the source side plug S_PLG. A plurality of drain side conductive layers DSL and WLp+1 to Wn may enclose the drain side plug D_PLG at different heights on the drain side plug D_PLG.

The interior of the U-shaped plug may be configured with a memory layer ONO and a channel layer including the pipe channel layer P_CH, and may be formed in such a way that the memory layer ONO encloses the surface of the channel layer. For example, the conductive layer WL0 and the memory layer ONO coupled to the conductive layer WL0 may constitute a memory cell. Here, the lowermost conductive layers may form word lines WLp and WLp+1, and the uppermost conductive layers may form a source select line SSL and a drain select line DSL. The conductive layers between the source select line SSL and the drain select line DSL may form word lines WL0 to WLn.

The source side plug S_PLG and the drain side plug D_PLG may be formed in a way that a plug hole is formed by successively stacking a plurality of conductive layers SSL, WL0 to WLn and DSL on top of one another and by etching it and then filling an empty space with a channel material. The plug hole may have a constant width regardless of the depth, but due to a manufacturing process variations the plug hole may taper as it extends downwardly. That is, the width of the vertical plug hole is greatest at its top end and smallest at its bottom end. For example, suppose that the width of upper portions of the U-shaped plug are first widths CD1 and the width of lower portions of the U-shaped plug are second widths CD2. In this example, the second width CD2 may be narrower than the first width CD1. Here, the first and second widths CD1 and CD2 are relative, and do not indicate widths at particular positions on the U-shaped plug. That is, if the width at a certain position on the U-shaped plug is the first width CD1, the width at a position lower than the position is the second width CD2.

As such, the width of the U-shaped plug may vary depending on the position. As a result, memory cells programmed by an identical program voltage may have different threshold voltages depending on the positions of the memory cells. For instance, a program operation for memory cells formed at the small-plug-width region of the U-shaped plug may proceed more rapidly than that of memory cells formed at the large-plug-width region of the U-shaped plug. That is, the memory cells formed at the small-plug-width region of the U-shaped plug may be called "fast" cells.

Figure 14:
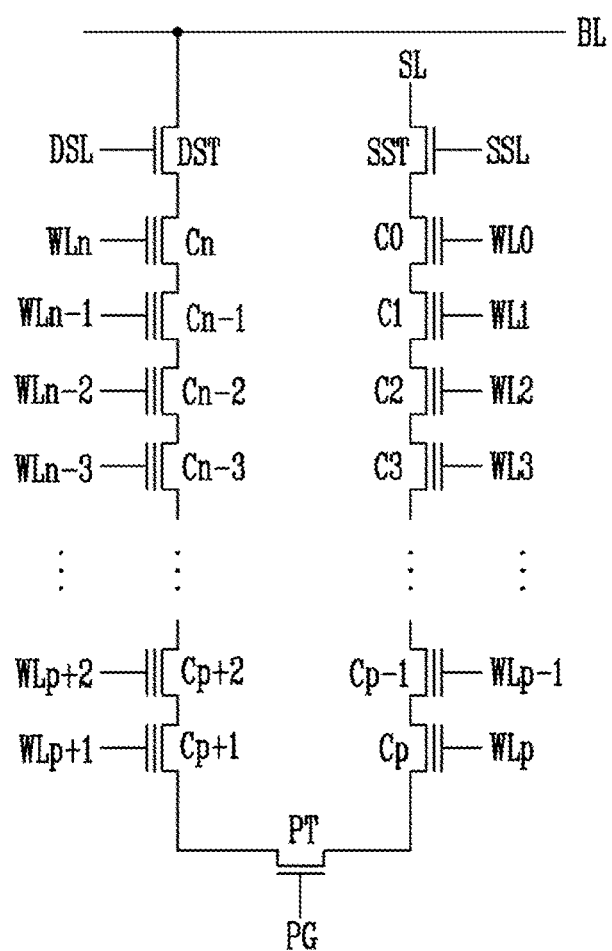
FIG. 14 is a diagram illustrating an example of the cell string of FIG. 12.

FIG. 14 is a diagram illustrating an example of the memory cell string of FIG. 12.

Referring to FIG. 14, the memory cell string may have a U shape. The memory cell string may be coupled between the common source line SL and the bit line BL, and may include the source select transistor SST, the memory cells C0 to Cn, a pipe transistor PT, and the drain select transistor DST. Among the memory cells C0 to Cn, memory cells disposed between the source select transistor SST and the pipe transistor PT may be defined as source side memory cells Cp to C0. Among the memory cells C0 to Cn, memory cells disposed between the drain select transistor DST and the pipe transistor PT may be defined as drain side memory cells Cp+1 to Cn. The source select transistor SST and the drain select transistor DST may be respectively coupled to the source select line SSL and the drain select line DSL. The memory cells C0 to Cn may be respectively coupled to the word lines WL0 to WLn. Furthermore, the pipe transistor PT is coupled to the pipe gate PG.

An operation method of the semiconductor memory device according to an embodiment of the present embodiment will be described with reference to FIGS. 6, 7 and 14.

A program operation may be performed sequentially, page by page, on the memory cells C0 to Cn. For example, memory cells that are coupled to the same word line and included in different cell strings are defined as one page. The source side memory cells Cp to C0 may be disposed at the same heights as the drain side memory cells Cp+1 to Cn.

Program voltages Vpgm gradually increasing by a first step voltage $\Delta V1$ may be applied to a selected page among the plurality of pages.

Pass voltages Vpass gradually increasing by second step voltages may be applied to unselected pages among the plurality of pages. Depending on where the unselected pages are on the U-shaped plug, the second step voltages of the pass voltages Vpass applied to the unselected pages may be maintained constant or may be increased or reduced.

According to an embodiment of the present disclosure, depending on the width of the U-shaped plug, the second step voltages of the pass voltages Vpass applied to the unselected pages may be maintained constant or may be increased or reduced. Pass voltages Vpass gradually increasing by second step voltages $\Delta V1\_1$ to $\Delta V1\_X$ may be applied to unselected pages including memory cells (e.g., C0 and Cn) disposed where the U-shaped plug is relatively wide. Each of the second step voltages $\Delta V1\_1$ to $\Delta V1\_X$ may be constant regardless of the number of iterations of applying pass voltages Vpass, or may be increased or reduced in proportion to the number of iterations of applying the pass voltages Vpass. Pass voltages Vpass gradually increasing by second step voltages $\Delta Vn\_1$ to $\Delta Vn\_X$ may be applied to unselected pages including memory cells (e.g., Cp and Cp+1) disposed where the U-shaped plug is relatively narrow. Each of the second step voltages $\Delta Vn\_1$ to $\Delta Vn\_X$ may be constant regardless of the number of iterations of applying the pass voltages Vpass, or may be increased or reduced in proportion to the number of iterations of applying the pass voltages Vpass.

The second step voltages of the pass voltages Vpass applied to the unselected pages in the large-plug-width region of the U-shaped plug may be larger than the second step voltages of the pass voltages Vpass applied to the unselected pages in the small-plug-width region of the U-shaped plug. For example, the smaller the width of the U-shaped plug, the smaller the second step voltage by which the pass voltages Vpass increase would be. For example, among the unselected pages, the pages including the memory cells C0 and Cn may be defined as uppermost pages. Pass voltages Vpass gradually increasing by second step voltages $\Delta V1\_1$ to $\Delta V1\_X$ may be applied to the uppermost pages. Among the unselected pages, pages including the memory cells Cp and Cp+1 may be defined as lowermost pages. Pass voltages Vpass gradually increasing by second step voltages $\Delta Vn\_1$ to $\Delta Vn\_X$ may be applied to the lowermost pages. The second step voltages of the pass voltages Vpass applied to the uppermost unselected pages may be larger than the second step voltages of the pass voltages Vpass applied to the lowermost unselected pages. As a result, among the pass voltages Vpass applied to the unselected pages, the last pass voltages Vpass applied to the uppermost unselected pages may be higher than the last pass voltage Vpass applied to the lowermost unselected page.

Furthermore, among the pass voltages Vpass applied to the unselected pages, the first (start) pass voltages may be equal to each other. Alternatively, the first (start) pass voltages may vary depending on whether the unselected pages are in the small-plug-width region or in the large-plug-width region.

Furthermore, among the unselected pages, second step voltages $\Delta Va\_1$ to $\Delta Va\_X$ of pass voltages Vpass applied to pages adjacent to the selected page may be equal to or greater than second step voltages of pass voltages Vpass applied to the remaining unselected pages other than the unselected pages adjacent to the selected page. Each of the second step voltages $\Delta Va\_1$ to $\Delta Va\_X$ of the pass voltages Vpass applied to, among the unselected pages, the pages adjacent to the selected page may be constant regardless of the number of iterations of applying the pass voltages Vpass or may be increased or reduced in proportion to the number of iterations of applying the pass voltages Vpass.

For example, when, among the plurality of pages, a page including the memory cell C1 is selected and program voltages Vpgm gradually increasing by the first step voltage $\Delta V1$ is applied to the page, pass voltages Vpass gradually increasing by the second step voltages $\Delta Va\_1$ to $\Delta Va\_X$ may be applied to pages respectively including the memory cell C0 and the memory cell C2 that are adjacent to the memory cell C1. Here, a difference value between the first step voltage $\Delta V1$ of the program voltages Vpgm applied to the selected page and the second step voltages $\Delta Va\_1$ to $\Delta Va\_X$ of the pass voltages Vpass applied to the unselected pages adjacent to the selected page may be set to be less than or equal to a preset value. For example, a difference value between the first step voltage $\Delta V1$ of the program voltages Vpgm applied to the selected page and the second step voltage $\Delta Va\_2$ of the pass voltages Vpass applied to the unselected pages adjacent to the selected page may be set to be less than or equal to a preset value. The second step voltages of the pass voltages Vpass applied to the remaining unselected pages other than the unselected pages adjacent to the selected page may be adjusted depending on the position of the plug or the width of the plug, as described with reference to FIG. 6.

Figure 15:
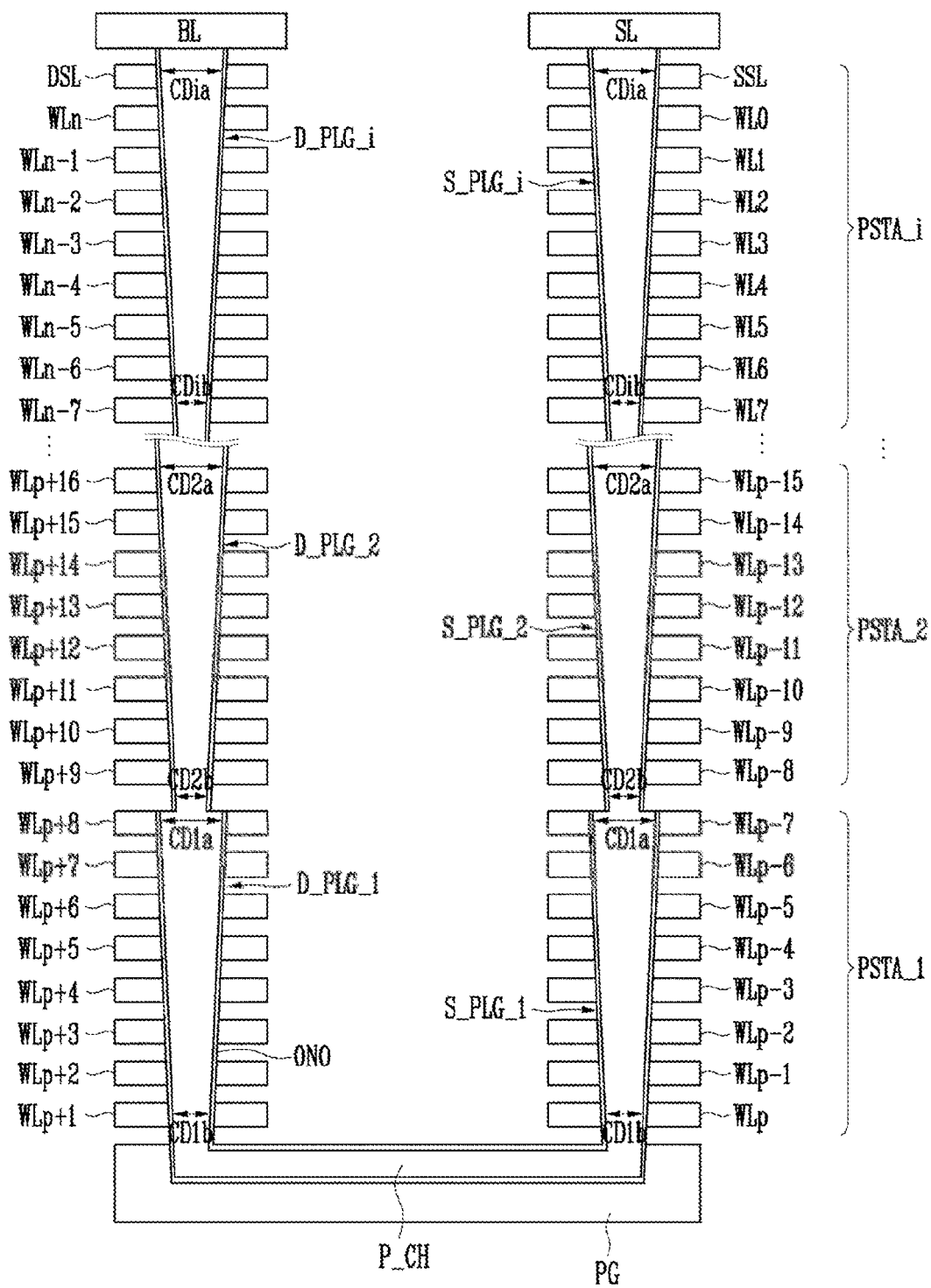
FIG. 15 is a cross-sectional view illustrating an example of the memory cell strings of FIG. 12 having a multi-stack structure.

FIG. 15 is a cross-sectional view illustrating an example of the memory cell strings of FIG. 12 having a multi-stack structure.

Referring to FIG. 15, the memory block may include a U-shaped plug. The U-shaped plug may form a pipe channel layer P_CH in a pipe gate PG. A pipe-shaped multi-stack structure may be vertically formed between the common source line SL and the pipe gate PG. A pipe-shaped multi-stack structure may be vertically formed between the bit line BL and the pipe gate PG. The pipe-shaped multi-stack structure may be configured with a plurality of pipe-shaped single stacks PSTA_1 to PSTA_i. Each of the pipe-shaped single stacks PSTA_1 to PSTA_i may include a plurality of conductive layers SSL, WL0 to WLn and DSL, a plurality of source side plugs S_PLG_1 to S_PLG_i, and a plurality of drain side plugs D_PLG_1 to D_PLG_i. Among the plurality of source side plugs S_PLG_1 to S_PLG_i, an upper end of the source side plug S_PLG_i may be coupled to the common source line SL, and a lower end of the source side plug S_PLG_1 may be coupled to the pipe channel layer P_CH. Among the plurality of drain side plugs D_PLG_1 to D_PLG_i, an upper end of the drain side plug D_PLG_i may be coupled to the bit line SL, and a lower end of the drain side plug D_PLG_1 may be coupled to the pipe channel layer P_CH. Among the plurality of conductive layers SSL, WL0 to WLn, and DSL, the lowermost conductive layers may form a word line WLp and a word line WLp+1, and the uppermost conductive layers may form a source select line SSL and a drain select line DSL. The conductive layers between the source select line SSL and the drain select line DSL may form word lines WL0 to WLn. The plurality of conductive layers SSL, WL0 to WLn, and DSL may enclose the plurality of source side plugs S_PLG_1 to S_PLG_i and the plurality of drain side plugs D_PLG_1 to D_PLG_i at different heights. The plurality of source side plugs S_PLG_1 to S_PLG_i and the plurality of drain side plugs D_PLG_1 to D_PLG_i may be configured with a channel layer and a memory layer ONO. The surface of the channel layer may enclosed by the memory layer ONO. For example, the word line WL0, and the memory layer ONO and channel layer coupled to the word line WL0 may constitute a memory cell.

Each of the pipe-shaped stacks PSTA_1 to PSTA_i may include a plurality of source side plugs S_PLG_1 to S_PLG_i and a plurality of drain side plugs D_PLG_1 to D_PLG_i. The widths of upper regions CD1a to CDia of the source side plugs S_PLG_1 to S_PLG_i and the drain side plugs D_PLG_1 to D_PLG_i may be greater than the widths of lower regions CD1b to CDib of the source side plugs S_PLG_1 to S_PLG_i and the drain side plugs D_PLG_1 to D_PLG_i. The source side plugs S_PLG_1 to S_PLG_i may be coupled to each other. The drain side plugs D_PLG_1 to D_PLG_i may be coupled to each other. Although FIG. 15 illustrates that each pipe-shaped stack PSTA_1 to PSTA_i has eight word lines, the present disclosure is not limited thereto.

Figure 16:
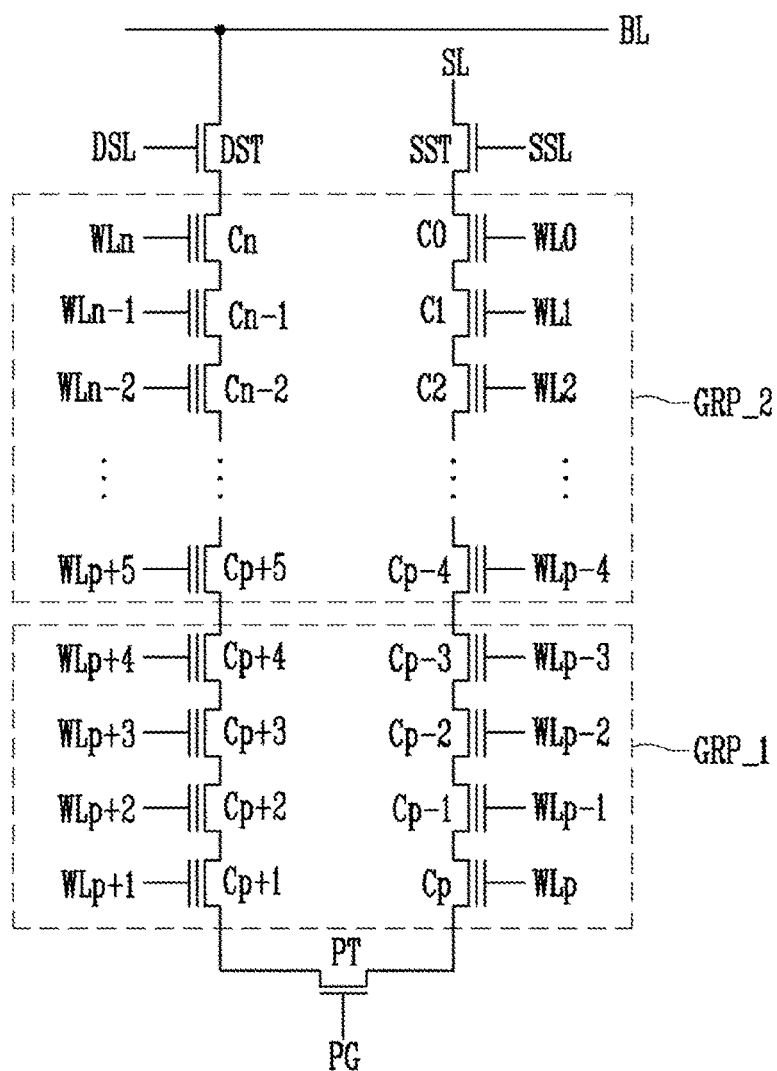
FIG. 16 is a diagram for describing an example of an operating method of a semiconductor memory device having the memory cell string of FIG. 14 that is divided into two groups.

FIG. 16 is a diagram for describing an example of an operating method of a semiconductor memory device having the memory cell string of FIG. 14 that is divided into two groups.

Referring to FIGS. 6, 7, 13 and 16, the U-shaped memory cell string may be coupled between the common source line SL and the bit line BL, and may include the source select transistor SST, the memory cells C0 to Cn, the pipe transistor PT, and the drain select transistor DST. Among the memory cells C0 to Cn, memory cells disposed between the source select transistor SST and the pipe transistor PT may be defined as source side memory cells Cp to C0. Among the memory cells C0 to Cn, memory cells disposed between the drain select transistor DST and the pipe transistor PT may be defined as drain side memory cells Cp+1 to Cn. The source select transistor SST and the drain select transistor DST may be respectively coupled to the source select line SSL and the drain select line DSL. The memory cells C0 to Cn may be respectively coupled to the word lines WL0 to WLn. Furthermore, the pipe transistor PT may be coupled to the pipe gate PG. A plurality of memory cells including the memory cells C0 to Cn may be included in different pages. A program operation for the plurality of memory cells including the memory cells C0 to Cn may be performed sequentially on a page basis. For example, a plurality of memory cells including the memory cell C0 coupled to the word line WL0 may be defined as one page. The memory cell string may be divided into two groups. For example, the memory cells Cp−3 to Cp+4 coupled to the word lines WLp−3 to WLp+4 may be included in a first group GRP_1, and the memory cells C0 to Cp−4 and Cp+5 to Cn coupled to the word lines WL0 to WLp−4 and WLp+5 to WLn may be included in a second group GRP_2. The number of memory cells coupled to the word lines included in each group may vary.

According to an embodiment of the present disclosure, the second step voltages of pass voltages Vpass respectively applied to the first group GRP_1 and the second group GRP_2 including unselected pages may be different from each other. For example, the second step voltages of the pass voltages Vpass applied to the first group GRP_1 disposed in a small-plug-width region of the U-shaped plug may be smaller than the second step voltages of the pass voltages Vpass applied to the second group GRP_2 disposed in a large-plug-width region of the U-shaped plug. Thus, the last applied pass voltages Vpass applied to the first group GRP_1 may be smaller than the last applied pass voltages Vpass applied to the second group GRP_2. Each of the second step voltages of the pass voltages Vpass applied to each of the unselected pages included in the first and second groups GRP_1 and GRP_2 may be constant regardless of the number of iterations of applying the pass voltages Vpass, or may be increased or reduced as the number of application is increased. Furthermore, among the pass voltages Vpass applied to the respective unselected pages included in the first and second groups GRP_1 and GRP_2, the first (start) pass voltages may be equal to each other. Alternatively, the first (start) pass voltages may be different from each other. Furthermore, second step voltages ΔVa_1 to ΔVa_X of pass voltages Vpass that are applied to, among the unselected pages included in the first and second groups GRP_1 and GRP_2, unselected pages disposed adjacent to a selected page may be equal to or larger than second step voltages of pass voltages Vpass applied to remaining unselected pages other than the unselected pages adjacent to the selected page. Here, a difference value between the first step voltage ΔV1 of the program voltages applied to the selected page and the second step voltages ΔVa_1 to ΔVa_X of the pass voltages Vpass applied to the unselected pages adjacent to the selected page may be less than or equal to a preset value.

Figure 17:
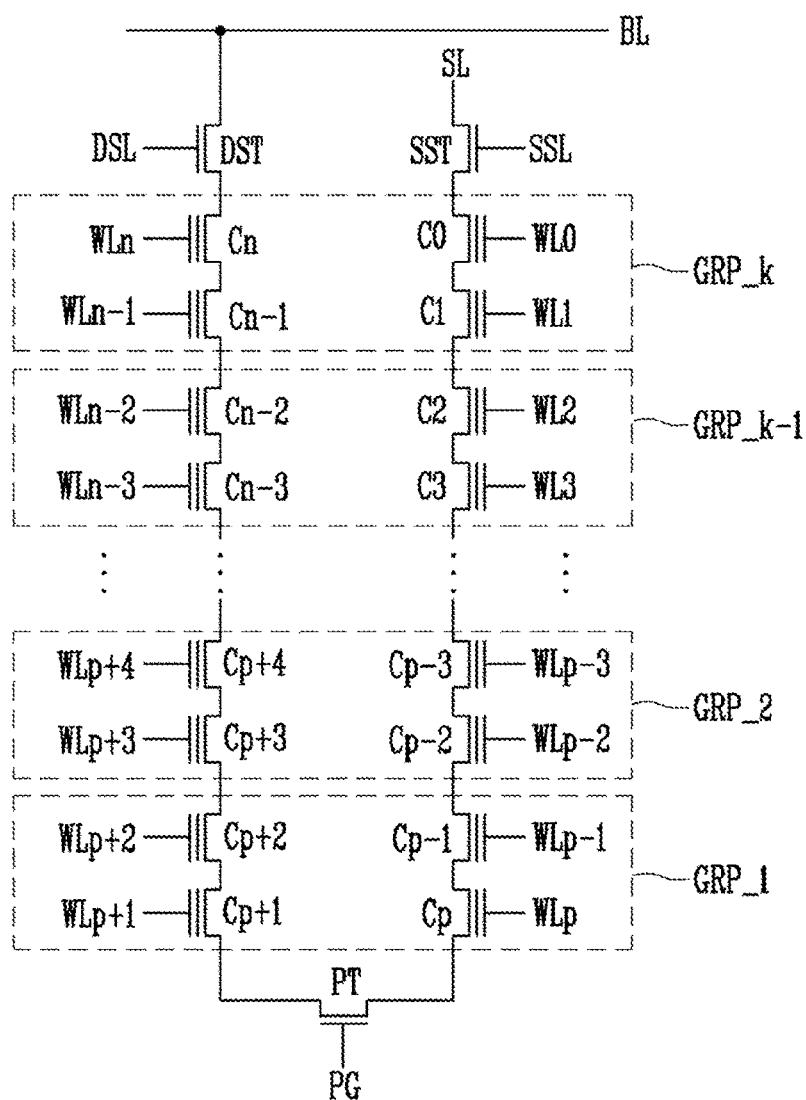
FIG. 17 is a diagram for describing an example of an operating method of a semiconductor memory device having the memory cell string of FIG. 14 that is divided into a plurality of groups.

FIG. 17 is a diagram for describing an example of an operating method of a semiconductor memory device having the memory cell string of FIG. 14 that is divided into a plurality of groups.

Referring to FIGS. 6, 7, 13 and 17, the U-shaped memory cell string is coupled between the common source line SL and the bit line BL and includes the source select transistor SST, the memory cells C0 to Cn, the pipe transistor PT and the drain select transistor DST. Among the memory cells C0 to Cn, memory cells disposed between the source select transistor SST and the pipe transistor PT may be defined as source side memory cells Cp to C0. Among the memory cells C0 to Cn, memory cells disposed between the drain select transistor DST and the pipe transistor PT may be defined as drain side memory cells Cp+1 to Cn. The source select transistor SST and the drain select transistor DST may be respectively coupled to the source select line SSL and the drain select line DSL. The memory cells C0 to Cn may be respectively coupled to the word lines WL0 to WLn. Furthermore, the pipe transistor PT may be coupled to the pipe gate PG. A plurality of memory cells including the memory cells C0 to Cn may be included in different pages. A program operation for the plurality of memory cells including the memory cells C0 to Cn may be performed sequentially on a page basis. For example, a plurality of memory cells including the memory cell C0 coupled to the word line WL0 may be defined as one page. Here, the memory cell string may be divided into a plurality of groups GRP_1 to GRP_k. For example, the memory cell Cp and the memory cell Cp−1 that are respectively coupled to the word line WLp and the word line WLp−1 and the memory cell Cp+1 and the memory cell Cp+2 that are respectively coupled to the word line WLp+1 and the word line WLp+2 may be included in a first group GRP_1. The memory cell Cp−2 and the memory cell Cp−3 that are respectively coupled to the word line WLp−2 and the word line WLp−3 and the memory cell Cp+3 and the memory cell Cp+4 that are respectively coupled to the word line WLp+3 and the word line WLp+4 may be included in a second group GRP_2. For example, the memory cell C2 and the memory cell C3 that are respectively coupled to the word line WL2 and the word line WL3 and the memory cell Cn-2 and the memory cell Cn-3 that are respectively coupled to the word line WLn-2 and the word line WLn-3 may be included in a $(k-1)^{th}$ group GRP_k−1. The memory cell C0 and the memory cell C1 that are respectively coupled to the word line WL0 and the word line WL1 and the memory cell Cn and the memory cell Cn-1 that are respectively coupled to the word line WLn and the word line WLn-1 may be included in a $k^{th}$ group GRP_k. The number of memory cells coupled to the word lines included in each group may vary.

According to an embodiment of the present disclosure, second step voltages of pass voltages Vpass applied to each of the groups GRP_1 to GRP_k including unselected pages may be different from each other. For example, if the memory cells of the $k^{th}$ group GRP_k are disposed where the U-shaped plug is relatively wide, the pass voltages Vpass applied to the memory cells of the $k^{th}$ group GRP_k may increase by relatively high second step voltage, and if the memory cells of the first group GRP_1 are disposed where the U-shaped plug is relatively narrow, the pass voltages Vpass applied to the first group GRP_1 may increase by relatively low second step voltage. In an embodiment, the second step voltages of the pass voltages Vpass applied to the respective groups GRP_1 to GRP_k may be gradually reduced. As a result, the last applied pass voltages Vpass, among the pass voltages Vpass, applied to the large-plug-width region of the U-shaped plug may be higher than the last applied pass voltages Vpass applied to a small-plug-width region of the U-shaped plug. Each second step voltage of the pass voltages Vpass applied to the unselected pages included in the groups GRP_1 to GRP_k may be constant regardless of the number of iterations of applying the pass voltages Vpass. Alternatively, each of the second step voltages of the pass voltages Vpass applied to the respective unselected pages may be increased or reduced as the number of application is increased. Furthermore, among the pass voltages Vpass applied to the respective unselected pages included in the groups GRP_1 to GRP_k, the first (start) pass voltages may be equal to each other. Alternatively, the first (start) pass voltages may vary depending on whether the unselected pages are in the small-plug-width region or in the large-plug-width region. In addition, second step voltages ΔVa_1 to ΔVa_X of pass voltages Vpass that are applied to, among the unselected pages included in the groups GRP_1 to GRP_k, unselected pages disposed adjacent to a selected page may be equal to or larger than second step voltages of pass voltages Vpass applied to remaining unselected pages other than the unselected pages adjacent to the selected page. Here, a difference value between the first step voltage ΔV1 of the program voltages applied to the selected page and the second step voltages ΔVa_1 to ΔVa_X of the pass voltages Vpass applied to the unselected pages adjacent to the selected page may be less than or equal to a preset value.

Figure 18:
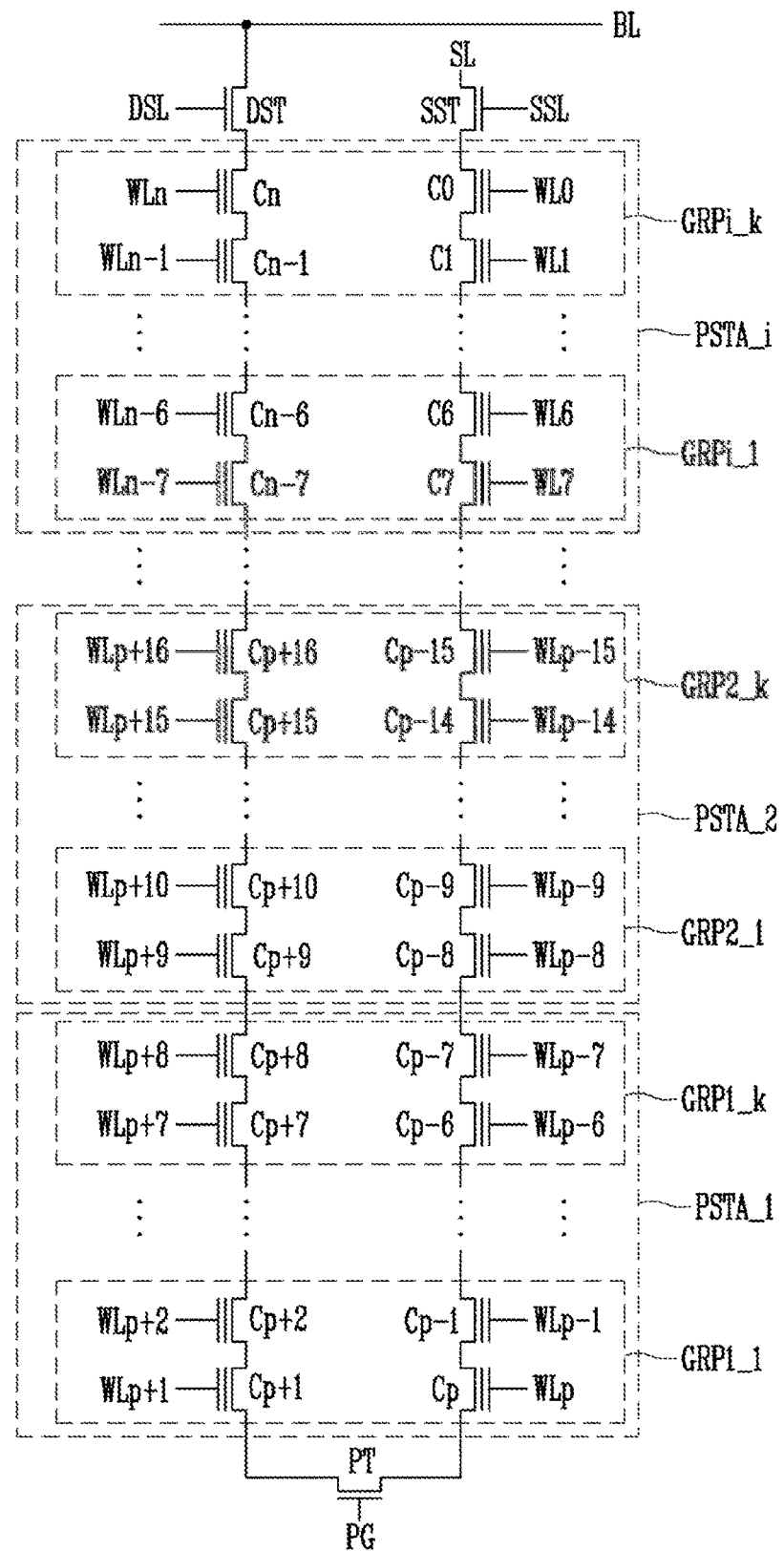
FIG. 18 is a diagram for describing an example of an operating method of a semiconductor memory device in which the memory cell string of FIG. 15 that is divided into a plurality of groups.

FIG. 18 is a diagram for describing an example of an operating method of a semiconductor memory device having the memory cell string of FIG. 15 that is divided into a plurality of groups.

Referring to FIGS. 6, 7, 15 and 18, the U-shaped memory cell string may be coupled between the common source line SL and the bit line BL, and may include the source select transistor SST, the memory cells C0 to Cn, the pipe transistor PT and the drain select transistor DST. Among the memory cells C0 to Cn, memory cells disposed between the source select transistor SST and the pipe transistor PT may be defined as source side memory cells Cp to C0. Among the memory cells C0 to Cn, memory cells disposed between the drain select transistor DST and the pipe transistor PT may be defined as drain side memory cells Cp+1 to Cn. The source select transistor SST and the drain select transistor DST are respectively coupled to the source select line SSL and the drain select line DSL. The memory cells C0 to Cn are respectively coupled to the word lines WL0 to WLn. A plurality of memory cells including the memory cells C0 to Cn may be included in different pages. Furthermore, the pipe transistor PT may be coupled to the pipe gate PG. A plurality of memory cells including the memory cells C0 to Cn may be included in different pages. A program operation for the plurality of memory cells including the memory cells C0 to Cn may be performed sequentially on a page basis. For example, a plurality of memory cells including the memory cell C0 coupled to the word line WL0 may be defined as one page. The memory cell string may be divided into a plurality of pipe-shaped single stacks PSTA_1 to PSTA_i. Each stack PSTA_1 to PSTA_i may be divided into a plurality of groups. For example, the pipe-shaped stack PSTA_1 may include a plurality of groups GRP1_1 to GRP1_k. The memory cell Cp and the memory cell Cp−1 that are respectively coupled to the word line WLp and the word line Wlp−1 and the memory cell Cp+1 and the memory cell Cp+2 that are respectively coupled to the word line WLp+1 and the word line WLp+2 may be included in a group GRP1_1. The memory cell Cp−6 and the memory cell Cp−7 that are respectively coupled to the word line WLp−6 and the word line WLp−7 and the memory cell Cp+7 and the memory cell Cp+8 that are respectively coupled to the word line WLp+7 and the word line WLp+8 may be included in a group GRP1_k. The pipe-shaped stack PSTA_2 may include a plurality of groups GRP2_1 to GRP2_k. The memory cell Cp−8 and the memory cell Cp−9 that are respectively coupled to the word line WLp−8 and the word line WLp−9 and the memory cell Cp+9 and the memory cell Cp+10 that are respectively coupled to the word line WLp+9 and the word line WLp+10 may be included in a group GRP2_1. The memory cell Cp−14 and the memory cell Cp−15 that are respectively coupled to the word line WLp−14 and the word line WLp−15 and the memory cell Cp+15 and the memory cell Cp+16 that are respectively coupled to the word line WLp+15 and the word line WLp+16 may be included in a group GRP2_k. The pipe-shaped stack PSTA_i may include a plurality of groups GRPi_1 to GRPi_k. The memory cell C6 and the memory cell C7 that are respectively coupled to the word line WL6 and the word line WL7 and the memory cell Cn-6 and the memory cell Cn-7 that are respectively coupled to the word line WLn-6 and the word line WLn-7 may be included in a group GRPi-1. The memory cell C0 and the memory cell C1 that are respectively coupled to the word line WL0 and the word line WL1 and the memory cell Cn and the memory cell Cn-1 that are respectively coupled to the word line WLn and the word line WLn-1 may be included in a group GRPi_k. Here, the number of memory cells included in the respective groups is not limited to that of FIG. 18.

According to an embodiment of the present disclosure, second step voltages of pass voltages Vpass applied to the respective groups included in the respective pipe-shaped stacks PSTA_1 to PSTA_i may be different from each other. For example, the second step voltages of the pass voltages Vpass applied to the group GRP1_$k$ of the pipe-shaped stack PSTA_1 disposed in the large-plug-width region of the U-shaped plug may be larger than the second step voltages of the pass voltages Vpass applied to the group GRP1_1 of the pipe-shaped stack PSTA_1 disposed in the small-plug-width region of the U-shaped plug. Likewise, the second step voltages of the pass voltages Vpass applied to the group GRP2_k of the pipe-shaped stack PSTA_2 disposed in the large-plug-width region of the U-shaped plug may be larger than the second step voltages of the pass voltages Vpass applied to the group GRP2_1 of the pipe-shaped stack PSTA_2 disposed in the small-plug-width region of the U-shaped plug. In addition, the second step voltages of the pass voltages Vpass applied to the group GRPi_k of the pipe-shaped stack PSTA_i disposed in the large-plug-width region of the U-shaped plug may be larger than the second step voltages of the pass voltages Vpass applied to the group GRPi_1 of the pipe-shaped stack PSTA_i disposed in the small-plug-width region. That is, the smaller the width of the U-shaped plug, the smaller the second step voltage by which the pass voltages Vpass increase would be. If the memory cells of unselected pages are disposed where the U-shaped plug is relatively wide, the pass voltages Vpass applied to the memory cells of the unselected pages may increase by relatively high second step voltage, and if the memory cells of unselected pages are disposed where the vertical plug is relatively narrow, the pass voltages Vpass applied to the memory cells of the unselected pages may increase by relatively low second step voltage. Each of the second step voltages of the pass voltages Vpass applied to the respective unselected pages included in the groups may be constant regardless of the number of iterations of applying the pass voltages Vpass, or may be increased or reduced as the number of application is increased. Furthermore, among the pass voltages Vpass applied to the respective unselected pages included in the groups, the first (start) pass voltages may be equal to each other. Alternatively, the first (start) pass voltages may different from each other. In addition, second step voltages $\Delta Va\_1$ to $\Delta Va\_X$ of pass voltages Vpass that are applied to, among the unselected pages included in the groups, unselected pages disposed adjacent to a selected page, may be equal to or larger than second step voltages of pass voltages Vpass applied to remaining unselected pages other than the unselected pages adjacent to the selected page. Here, a difference value between the first step voltage $\Delta V1$ of the program voltages applied to the selected page and the second step voltages $\Delta Va\_1$ to $\Delta Va\_X$ of the pass voltages Vpass applied to the unselected pages adjacent to the selected page may be less than or equal to a preset value.

As described above, program voltages Vpgm gradually increasing by a first step voltage $\Delta V1$ may be applied to a selected page among a plurality of pages, and pass voltages Vpass gradually increasing by different second step voltages may be applied to unselected pages. Depending on where the portion of the vertical plug is and depending on the width of the plug, the second step voltages of the pass voltages Vpass applied to the unselected pages may be maintained constant or may be increased or reduced. In detail, depending on whether the memory cells of the unselected pages are disposed where the plug is relatively wide or whether the memory cells of the unselected pages are disposed where the plug is relatively narrow, the second step voltages of the pass voltages Vpass applied to the unselected pages may vary. That is, the smaller the width of the plug, the smaller the second step voltage by which the pass voltages Vpass increase would be. Moreover, in an embodiment, the second step voltages of the pass voltages Vpass applied to the unselected pages may be gradually reduced. Consequently, the last pass voltages Vpass applied to a small-plug-width region may be lower than the last pass voltages Vpass applied to a large-plug-width region, and thus pass disturb can be mitigated. Furthermore, the second step voltages of the pass voltages Vpass applied to unselected pages adjacent to the selected page may be equal to or greater than that of the remaining unselected pages that do not adjacent to the selected page. A difference value between the first step voltage $\Delta V1$ of the program voltages Vpgm applied to the selected page and each of the second step voltages $\Delta Va\_1$ to $\Delta Va\_X$ of the pass voltages Vpass applied to the unselected pages adjacent to the selected page may be set to be less than or equal to a preset value, and thus the pass disturb can be mitigated.

Figure 19:
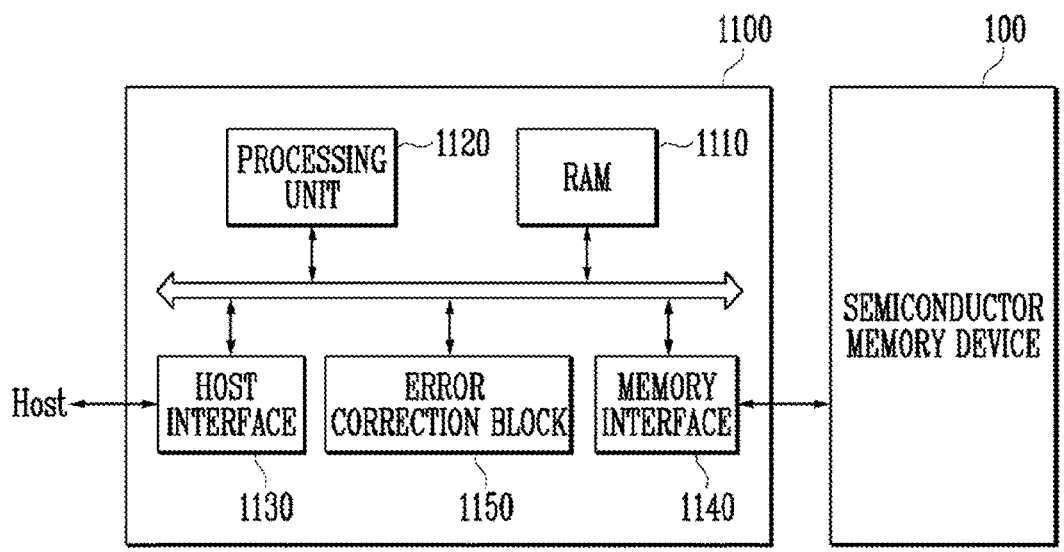
FIG. 19 is a diagram illustrating an example of a memory system including the semiconductor memory device of FIG. 1.

FIG. 19 is a diagram illustrating an example of a memory system including the semiconductor memory device of FIG. 1.

Referring to FIG. 19, the memory system 1000 may include the semiconductor memory device 100 and a controller 1100.

Configurations and operations of the semiconductor memory device 100 may be the same as those of the semiconductor memory device described with reference to FIG. 1, and thus any repetitive detailed description will be omitted or simplified.

The controller 1100 may be coupled to a host Host and the semiconductor memory device 100. The controller 1100 is configured to access the semiconductor memory device 100 in response to a request from the host Host. For example, the controller 1100 is configured to control read, write, erase, and background operations of the semiconductor memory device 100. The controller 1100 may provide an interface between the host Host and the semiconductor memory device 100. The controller 1100 is configured to drive firmware for controlling the semiconductor memory device 100.

The controller 1100 includes a Random Access Memory (RAM) 1110, a processing unit 1120, a host interface 1130, a memory interface 1140, and an error correction block 1150. The RAM 1110 may be used as at least one of an operation memory of the processing unit 1120, a cache memory between the semiconductor memory device 100 and the host Host, and a buffer memory between the semiconductor memory device 100 and the host Host. The processing unit 1120 may control the overall operation of the controller 1100. In addition, the controller 1100 may temporarily store program data provided from the host Host during the write operation.

The host interface 1130 may include a protocol for performing data exchange between the host Host and the controller 1100. In an embodiment, the controller 1200 may communicate with the host Host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, and an integrated drive electronics (IDE) protocol, a private protocol, and the like.

The memory interface 1140 may interface with the semiconductor memory device 100. For example, the memory interface may include a NAND interface or NOR interface.

The error correction block 1150 may use an error correcting code (ECC) to detect and correct an error in data received from the semiconductor memory device 100. In an embodiment, the error correction block may be provided as an element of the controller 1100.

The controller 1100 and the semiconductor memory device 100 may be integrated into a single semiconductor device. In an embodiment, the controller 1100 and the semiconductor memory device 100 may be integrated into a memory card. For example, the controller 1100 and the semiconductor memory device 100 may be integrated into a single semiconductor device and form a memory card such as a personal computer memory card international association (PCMCIA), a compact flash card (CF), a smart media card (SM or SMC), a memory stick multimedia card (e.g., MMC, RS-MMC, or MMCmicro), a SD card (e.g., SD, miniSD, microSD, or SDHC), a universal flash storage (UFS), and the like.

The controller 1100 and the semiconductor memory device 100 may be integrated into a single semiconductor device to form a solid state drive (SSD). The SSD includes a storage device formed to store data in a semiconductor memory.

In an embodiment, the memory system 1000 may be provided as one of various elements of an electronic device such as a computer, a ultra mobile PC (UMPC), a workstation, a net-book, a personal digital assistants (PDA), a portable computer, a web tablet, a wireless phone, a mobile phone, a smart phone, an e-book, a portable multimedia player (PMP), a game console, a navigation device, a black box, a digital camera, a 3-dimensional television, a digital audio recorder, a digital audio player, a digital picture recorder, a digital picture player, a digital video recorder, a digital video player, a device capable of transmitting/receiving information in an wireless environment, one of various devices for forming a home network, one of various electronic devices for forming a computer network, one of various electronic devices for forming a telematics network, an RFID device, one of various elements for forming a computing system, or the like.

In an embodiment, the semiconductor memory device 100 or the memory system 1000 may be embedded in various types of packages. Examples of the packages may include Package on Package (PoP), Ball grid arrays (BGAs), Chip scale packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), or the like.

Figure 20:
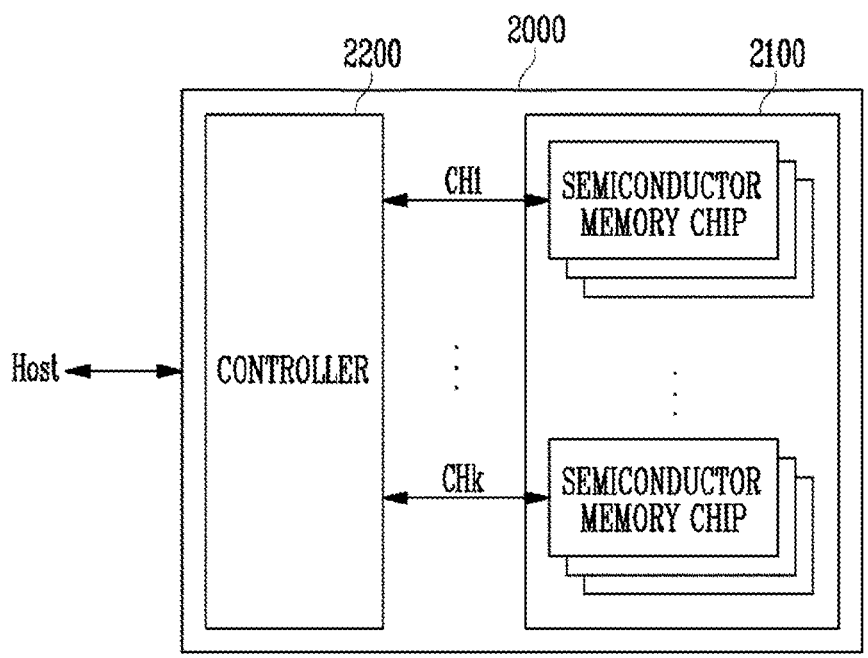
FIG. 20 is a diagram illustrating an example of a memory system including the semiconductor memory device of FIG. 1.

FIG. 20 is a diagram illustrating an example of a memory system including the semiconductor memory device of FIG. 1.

Referring FIG. 20, the memory system 2000 includes a semiconductor memory device 2100 and a controller 2200. The semiconductor memory device 2100 includes a plurality of memory chips. The semiconductor memory chips are divided into a plurality of groups.

In FIG. 20, it is illustrated that each of the plurality of groups communicates with the controller 2200 through first to $k_{th}$ channels CH1 to CHk. Configurations and operations of the semiconductor memory chips illustrated in FIG. 7 may be the same as those of the semiconductor memory device 100 described with reference to FIG. 1.

Each group may communicate with the controller 2200 through one common channel. The controller 2200 may have the same configuration as that of the controller 1100 described with reference to FIG. 19, and may control operations of memory chips of the semiconductor memory device 2100 through the plurality of channels CH1 to CHk.

Figure 21:
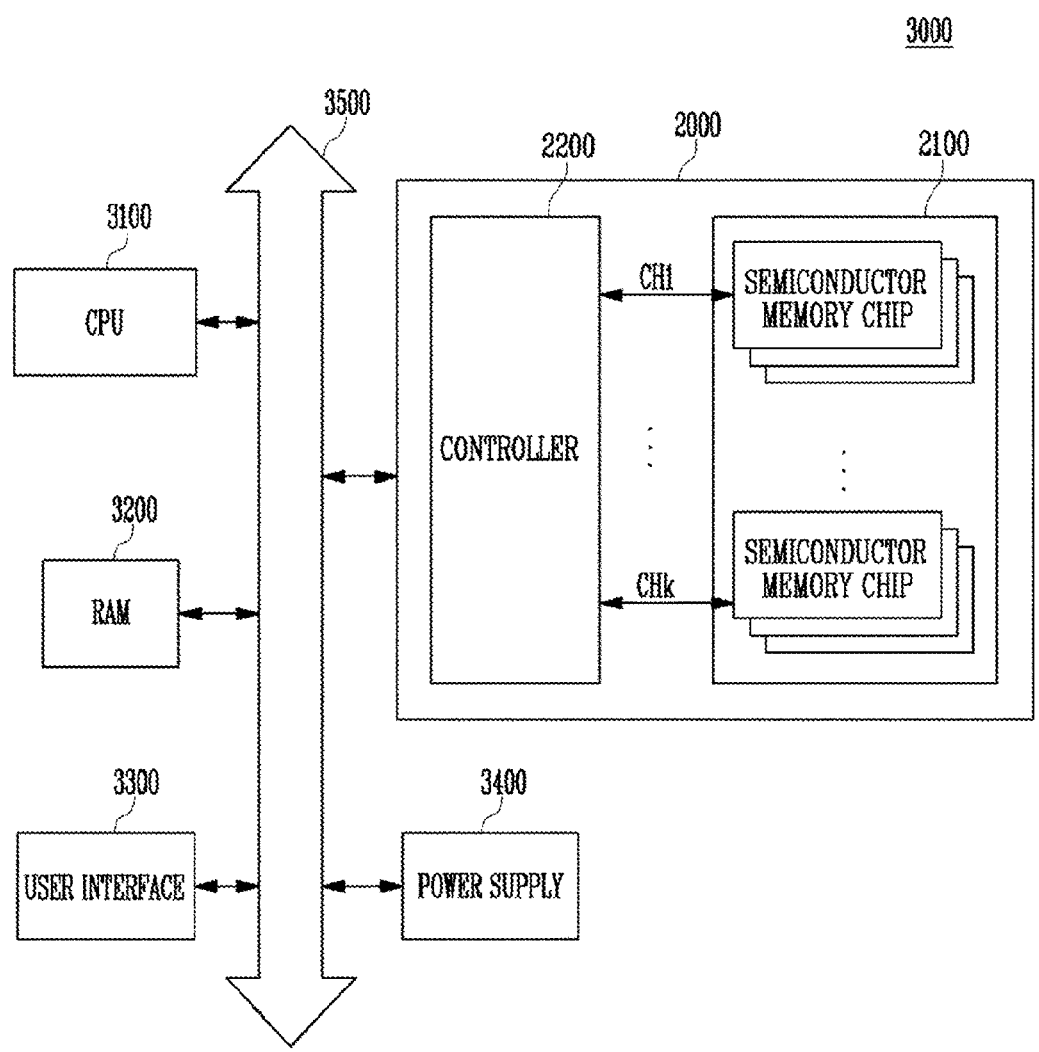
FIG. 21 is a diagram illustrating an example of a computing system including the memory system of FIG. 20.

FIG. 21 is a diagram illustrating an example of a computing system including the memory system of FIG. 20.

Referring to FIG. 21, the computing system 3000 may include a central processing unit 3100, a RAM 3200, a user interface 3300, a power supply 3400, a system bus 3500, and a memory system 2000.

The memory system 2000 may be electrically coupled to the CPU 3100, the RAM 3200, the user interface 3300, and the power supply 3400 through the system bus 3500. Data provided through the user interface 3300 or processed by the CPU 3100 may be stored in the memory system 2000.

In FIG. 21, the semiconductor memory device 2100 is illustrated as being coupled to the system bus 3500 through the controller 2200. However, the semiconductor memory device 2100 may be directly coupled to the system bus 3500. The function of the controller 2200 may be performed by the CPU 3100 and the RAM 3200.

In FIG. 21, it is illustrated that the memory system 2000 described with reference to FIG. 20 is being used. However, the memory system 2000 may be replaced with the memory system 1000 described with reference to FIG. 19. In an embodiment, the computing system 3000 may include all of the memory systems 1000 and 2000 described with reference to FIGS. 19 and 20.

In applying pass voltages to a plurality of unselected pages included in a memory cell array, various embodiments of the present disclosure may increase the pass voltages by step voltages, and the step voltages may vary depending on where the unselected pages are, thus mitigating a disturb phenomenon of a semiconductor memory device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor memory device comprising:
   a memory cell array including memory cells grouped into a plurality of pages;
   peripheral circuits configured to perform a program operation for the plurality of pages; and
   a control logic configured to control the peripheral circuits to perform the program operation by applying program voltages gradually increasing by a first step voltage to a selected page of the plurality of pages and by applying pass voltages gradually increasing by second step voltages to unselected pages of the plurality of pages, the second step voltages varying depending on a position of the memory cells of the unselected pages in the memory cell array.

2. The semiconductor memory device according to claim 1, wherein the memory cells are vertically stacked along a vertical plug on a semiconductor substrate.

3. The semiconductor memory device according to claim 2, wherein the control logic controls the peripheral circuits such that, depending on the position of the memory cells of the unselected pages on the plug, the second step voltages of the pass voltages applied to the unselected pages are maintained constant or are increased or reduced.

4. The semiconductor memory device according to claim 2, wherein the control logic controls the peripheral circuits such that, depending on a width of the plug, the second step voltages of the pass voltages applied to the unselected pages are adjusted.

5. The semiconductor memory device according to claim 4, wherein, if the memory cells of unselected pages are disposed where the plug is relatively wide, the pass voltages applied to the memory cells of the unselected pages increase by relatively high second step voltage, and if the memory cells of unselected pages are disposed where the vertical plug is relatively narrow, the pass voltages applied to the memory cells of the unselected pages increase by relatively low second step voltage.

6. The semiconductor memory device according to claim 5, wherein a last applied pass voltages applied to the memory cells of the unselected pages disposed where the plug is relatively narrow is lower than a last applied pass voltages applied to the memory cells of the unselected pages disposed where the plug is relatively wide.

7. The semiconductor memory device according to claim 2, wherein the control logic divides the plurality of pages into a plurality of groups and controls the peripheral circuits such that the second step voltages of the pass voltages applied to the respective groups are different from each other.

8. The semiconductor memory device according to claim 7, wherein the control logic controls the peripheral circuits such that, when the pass voltages are applied to groups disposed where the plug is relatively narrow, the second step voltages of the pass voltages are gradually reduced.

9. The semiconductor memory device according to claim 1, wherein the control logic controls the peripheral circuits such that each of the second step voltages of the pass voltages applied to the respective unselected pages is constant regardless of the number of iterations of applying the pass voltages or is increased or reduced as the number of application is increased.

10. The semiconductor memory device according to claim 1, wherein, among the pass voltages applied to the respective unselected pages, first pass voltages are equal to or different from each other.

11. The semiconductor memory device according to claim 1, wherein the control logic controls the peripheral circuits such that when the pass voltages are applied to unselected pages that are adjacent to the selected page, the second step voltages thereof are equal to or greater than second step voltages of pass voltages applied to remaining unselected pages other than the pages adjacent to the selected page.

12. The semiconductor memory device according to claim 11, wherein the control logic controls the peripheral circuits such that a difference value between the first step voltage of the program voltages and each of the second step voltages of the pass voltages applied to the pages adjacent to the selected page is less than or equal to a preset value.

13. An operating method of a semiconductor memory device for a program operation of a memory block including a plurality of pages having a plurality of memory cells vertically stacked along a vertical plug on a semiconductor substrate, the operating method comprising:
applying program voltages gradually increasing by a first step voltage to a selected page of the plurality of pages; and
applying pass voltages gradually increasing by second step voltages to unselected pages of the plurality of pages,
wherein the second step voltages of the pass voltages applied to the unselected pages vary depending on a position of the memory cells of the unselected pages in the memory cell array.

14. The operating method according to claim 13, wherein the second step voltages of the pass voltages applied to the unselected pages are adjusted depending on a position on the plug or a width of the plug.

15. The operating method according to claim 14, wherein, if the memory cells of unselected pages are disposed where the plug is relatively wide, the pass voltages applied to the memory cells of the unselected pages increase by relatively high second step voltage, and if the memory cells of unselected pages are disposed where the vertical plug is relatively narrow, the pass voltages applied to the memory cells of the unselected pages increase by relatively low second step voltage.

16. The operating method according to claim 13, wherein the plurality of pages are divided into a plurality of groups, and the second step voltages of the pass voltages applied to the respective groups are different from each other.

17. The operating method according to claim 16, wherein when the pass voltages are applied to groups disposed where the plug is relatively narrow, the second step voltages of the pass voltages are gradually reduced.

18. The operating method according to claim 13, wherein each of the second step voltages of the pass voltages applied to the respective unselected pages is constant regardless of the number of iterations of applying the pass voltages or is increased or reduced as the number of application is increased.

19. The operating method according to claim 13, wherein when the pass voltages are applied to unselected pages that are adjacent to the selected page, the second step voltages thereof are equal to or greater than second step voltages of pass voltages applied to remaining unselected pages other than the pages adjacent to the selected page.

20. The operating method according to claim 19, wherein a difference value between the first step voltage of the program voltages and each of the second step voltages of the pass voltages applied to the pages adjacent to the selected page is less than or equal to a preset value.

* * * * *